US007291441B2

(12) United States Patent
Sato

(10) Patent No.: US 7,291,441 B2

(45) Date of Patent: Nov. 6, 2007

(54) POSITIVE RESIST COMPOSITION AND PATTERN FORMING METHOD UTILIZING THE SAME

(75) Inventor: Kenichiro Sato, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 250 days.

(21) Appl. No.: 11/210,672

(22) Filed: Aug. 25, 2005

(65) Prior Publication Data

US 2006/0046190 A1 Mar. 2, 2006

(30) Foreign Application Priority Data

Aug. 26, 2004 (JP) .......................... P.2004-246995
Mar. 11, 2005 (JP) .......................... P.2005-068921

(51) Int. Cl.
*G03F 7/004* (2006.01)
*G03F 7/30* (2006.01)

(52) U.S. Cl. .................. 430/270.1; 430/326; 430/905; 430/910

(58) Field of Classification Search ............. 430/270.1, 430/326, 905, 910
See application file for complete search history.

(56) References Cited

U.S. PATENT DOCUMENTS

| | | | | |
|---|---|---|---|---|
| 6,280,898 | B1 * | 8/2001 | Hasegawa et al. | 430/270.1 |
| 6,492,091 | B2 * | 12/2002 | Kodama et al. | 430/270.1 |
| 6,579,659 | B2 * | 6/2003 | Uetani et al. | 430/270.1 |
| 6,673,518 | B2 * | 1/2004 | Nishi et al. | 430/270.1 |
| 7,037,995 | B2 * | 5/2006 | Watanabe et al. | 526/329.6 |
| 2001/0026901 | A1 * | 10/2001 | Maeda et al. | 430/270.1 |
| 2004/0146802 | A1 | 7/2004 | Yamamoto et al. | |

FOREIGN PATENT DOCUMENTS

| | | | |
|---|---|---|---|
| EP | 1 143 299 | A1 | 10/2001 |
| EP | 1 681 307 | A1 | 7/2006 |
| JP | 2000-159758 | A | 6/2000 |
| JP | 2001-109154 | A | 4/2001 |
| JP | 2002-212174 | A | 7/2002 |
| JP | 2002-296783 | A | 10/2002 |

OTHER PUBLICATIONS

European Search Report dated Apr. 5, 2007.

* cited by examiner

*Primary Examiner*—John S. Chu
(74) *Attorney, Agent, or Firm*—Sughrue Mion Pllc.

(57) ABSTRACT

A positive resist composition comprising: a resin that comprises a repeating unit including a specific norbornane lactone structure and a repeating unit including a specific alicyclic hydrocarbon structure, and that increases a solubility of the resin in an alkaline developer by an action of an acid; and a compound that generates an acid upon treatment with one of an actinic ray and radiation, and a pattern forming method utilizing the same.

7 Claims, No Drawings

POSITIVE RESIST COMPOSITION AND PATTERN FORMING METHOD UTILIZING THE SAME

BACKGROUND OF THE INVENTION

1. Field of the Invention

The present invention relates to a positive resist composition to be employed in a process for producing a lithographic printing plate or a semiconductor device such as an IC, a process for producing a circuit board for a liquid crystal display or a thermal head, and other photofabrication processes, and a pattern forming method utilizing the same. In particular, the present invention relates to a positive resist composition functioning by a radiation of a high energy such as a far ultraviolet light (including an excimer laser), an electron beam, an X-ray or a light irradiation and suitable for preparing a semiconductor integrated circuit, and a pattern forming method utilizing the same.

2. Description of the Related Art

In a manufacturing process for a semiconductor device such as an IC or an LSI, a lithographic fine working with a photoresist composition has been employed. With a recent progress in the level of integration of the integrated circuits, there is being required formation of an ultrafine pattern in a submicron region or a quarter micron region. Together with such trend, the exposing wavelength is getting shorter, from g-line to i-line and further to a laser light of a KrF excimer laser. At present, a lithography utilizing an excimer laser light constitutes an important working technology in this field, and a chemical amplification resist is employed as a resist material suitable for such excimer laser lithographic process.

A chemical amplification resist composition is a pattern forming material which generates an acid in an exposed area by an irradiation with a radiation such as a far ultraviolet light, and differentiating a solubility to a developer between an area irradiated with the actinic radiation and a non-irradiated area by a reaction catalyzed by such acid, thereby forming a pattern on a substrate. The chemical amplification resist composition has a high sensitivity and a high resolution and has an advantage capable of an image formation by a compound which generates an acid by a little irradiation with a radiation (hereinafter called a "photoacid generator").

The chemical amplification resist composition can be classified into a three-component system constituted of an alkali-soluble resin, a photoacid generator, and a dissolution inhibiting compound, having an acid decomposable group, to the alkali-soluble resin; a two-component system constituted of a resin having a group that is decomposed by a reaction with an acid to become soluble in an alkali, and a photoacid generator; and a hybrid system constituted of a resin having a group that is decomposed by a reaction with an acid to become soluble in an alkali, a low-molecular dissolution inhibiting compound having an acid decomposable group, and a photoacid generator. In the positive chemical amplification resist of such two-component system, three-component system or hydrid system, there is executed a thermal treatment in the presence of an acid generated from a photoacid generator by an exposure, followed by a development to obtain a resist pattern.

In a lithography utilizing a chemical amplification resist, there is required a photoresist excellent in various characteristics such as a sensitivity, a resolution, a profile, a coating property, a heat resistance, a dry etching resistance, an adhesion, a substrate dependence, an environmental stability (for example a dimensional stability to a change in time after coating), and a depth of focus (for example a pattern forming property against an out-of-focus state in an irradiation with a radiation), and many methods for performance improvement with additives have been disclosed.

For example, JP-A No. 2001-109154 and JP-A No. 2002-296783 disclose a resist composition containing norbornane lactone. However such resist composition, containing norbornane lactone, is poor in solubility in a solvent, and may cause a development defect. Also a further improvement is desired in imaging performance such as a light width roughness (LWR).

Also JP-A No. 2002-212174 discloses a norbornane lactone compound of a specified structure. Also JP-A No. 2000-159758 discloses various resist compositions. However, there has not been found a resist composition capable of meeting the aforementioned requirements.

SUMMARY OF THE INVENTION

An object of the present invention is to provide a positive resist composition capable of improving a problem of development defect, providing an excellent in-plane uniformity of line width, and providing an excellent LWR property, and a pattern forming method utilizing the same.

The present inventors, as a result of intensive investigations on the components of the positive resist composition, have found that the aforementioned object can be attained by a following configuration, and have thus made the present invention. Thus, the aforementioned object can be attained by the following configuration.

(1) A positive resist composition comprising:

(A) a resin that comprises a repeating unit represented by formula (1) and a repeating unit represented by formula (2), and that increases a solubility of the resin (A) in an alkaline developer by an action of an acid; and (B) a compound that generates an acid upon treatment with one of an actinic ray and radiation:

(1)

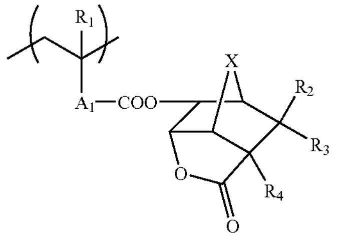

(2)

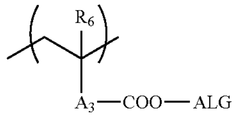

wherein $R_1$ represents a hydrogen atom or an alkyl group;

$R_2$ represents an alkyl group or an alkoxy group;

$R_3$ represents a hydrogen atom, an alkyl group, an alkoxy group, a carboxyl group or a group represented by $-COOR_7$, in which $R_7$ represents a hydrocarbon group;

$R_4$ represents a hydrogen atom or an alkyl group;

X represents a methylene group or an oxygen atom;

$R_6$ represents a hydrogen atom or an alkyl group;

$A_1$ represents a single bond or a divalent connecting group;

$A_3$ represents a single bond or a divalent connecting group; and

ALG represents a partial structure including an alicyclic hydrocarbon represented by formulae (pI) to (pV):

(pI)

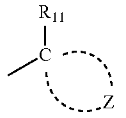

(pII)

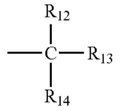

(pIII)

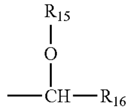

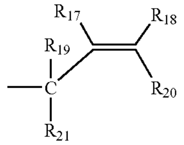

(pV)

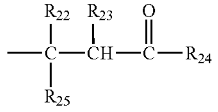

wherein $R_{11}$ represents an alkyl group; and Z represents an atomic group necessary for forming an alicyclic hydrocarbon group together with a carbon atom;

$R_{12}$ to $R_{16}$ each independently represents an alkyl group or an alicyclic hydrocarbon group, provided that at least one of $R_{12}$ to $R_{14}$ or one of $R_{15}$ and $R_{16}$ represents an alicyclic hydrocarbon group;

$R_{17}$ to $R_{21}$ each independently represents a hydrogen atom, an alkyl group or an alicyclic hydrocarbon group, provided that at least one of $R_{17}$ to $R_{21}$ represents an alicyclic hydrocarbon group, and one of $R_{19}$ and $R_{21}$ represents an alkyl group or an alicyclic hydrocarbon group; and $R_{22}$ to $R_{25}$ each independently represents an alkyl group or an alicyclic hydrocarbon group, provided that at least one of $R_{22}$ to $R_{25}$ represents an alicyclic hydrocarbon group, and $R_{23}$ and $R_{24}$ may be mutually bonded to form a ring.

(2) The positive resist composition as described in (1) above, wherein the resin (A) further comprises a repeating unit represented by formula (3):

(3)

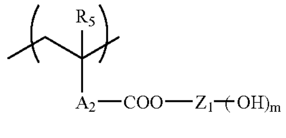

wherein $R_5$ represents a hydrogen atom or an alkyl group;

$Z_1$ represents an (m+1)-valent alicyclic hydrocarbon group;

$A_2$ represents a single bond or a divalent connecting group; and m represents an integer of 1 to 3.

(3) The positive resist composition as described in (2) above, wherein the repeating unit represented by formula (3) is a repeating unit represented by formula (Ia):

(Ia)

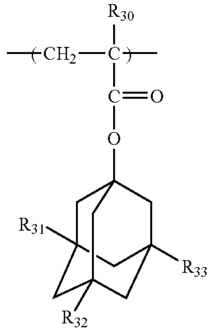

wherein $R_{30}$ represents a hydrogen atom or a methyl group; and $R_{31}$ to $R_{33}$ each independently represents a hydrogen atom, a hydroxyl group or an alkyl group, provided that at least one of $R_{31}$ to $R_{33}$ represents a hydroxyl group.

(4) The positive resist composition as described in any of (1) to (3) above, wherein the resin (A) further comprises a repeating unit having an alicyclic lactone structure.

(5) The positive resist composition as described in any of (1) to (4) above, wherein the resin (A) further comprises a methacrylic acid repeating unit.

(6) The positive resist composition as described in any of (1) to (5) above, wherein the resin (A) comprises two or more repeating units represented by formula (2) in which groups represented by ALG of the two or more repeating units are mutually different.

(7) A pattern forming method comprising:

forming a resist film from a positive resist composition as described in any of (1) to (6) above;

exposing the resist film, so as to form an exposed resist film; and developing the exposed resist film.

DETAILED DESCRIPTION OF THE INVENTION

In the following, the present invention will be explained in detail.

In the present specification, a description of a group (atomic group) not specifying "substituted" or "non-substituted" includes both a group not having a substituent and a group having a substituent. For example, "an alkyl group" includes not only an alkyl group not having a substituent (non-substituted alkyl group) and an alkyl group having a substituent (substituted alkyl group).

[1] Resin Showing an Increased Solubility in an Alkaline Developer by an Action of an Acid (Component A)

A resin to be employed in the positive resist composition of the invention, decomposable with an acid and showing an increase in a solubility in an alkaline developer includes a repeating unit (a) represented by formula (1) and a repeating unit (b) represented by formula (2):

(1)

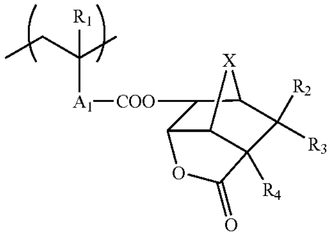

(2)

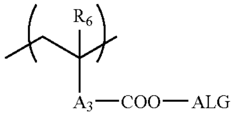

wherein, in formulae (1) and (2):

$R_1$ represents a hydrogen atom or an alkyl group;

$R_2$ represents an alkyl group or an alkoxy group;

$R_3$ represents a hydrogen atom, an alkyl group, an alkoxy group, a carboxyl group or a group represented by $-COOR_7$, in which $R_7$ represents a hydrocarbon group;

$R_4$ represents a hydrogen atom or an alkyl group;

X represents a methylene group or an oxygen atom;

$R_6$ represents a hydrogen atom or an alkyl group;

$A_1$ represents a single bond or a divalent connecting group;

$A_3$ represents a single bond or a divalent connecting group; and

ALG represents a partial structure including an alicyclic hydrocarbon represented by formulae (pI) to (pV) shown in the following.

In the formulae (1) and (2), the hydrocarbon group may be linear or cyclic, can for example be a linear, branched or cyclic alkyl group (preferably with 1 to 20 carbon atoms), which may have a substituent or may include a hetero atom such as an oxygen atom in the chain of the alkyl group. It can for example be a methyl group, a linear or branched propyl group, a linear or branched butyl group, a linear of branched pentyl group, a linear, branched or cyclic hexyl group, adamantyl, norbornyl, butyrolactone, cyclohexanelactone, or norbornanelactone.

The alkyl group may be linear or branched, and is preferably an alkyl group with 1 to 12 carbon atoms, more preferably a linear or branched alkyl group with 1 to 10 carbon atoms, further preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group, or a decyl group. Particularly preferably it is an alkyl group with 1 to 4 carbon atoms.

Such alkyl group may be further substituted, and such substitutent can be an alkoxy group with 1 to 4 carbon atoms, a halogen atom (fluorine atom, chlorine atom, bromine atom or iodine atom), an acyl group, an acyloxy group, a cyano group, a hydroxyl group, a carboxy group, an alkoxycarbonyl group, or a nitro group.

The alkoxy group preferably has 1 to 4 carbon atoms, such as a methoxy group, an ethoxy group, a propoxy group or a butoxy group.

The divalent connecting group is preferably a single group or a combination of two or more groups, selected from an alkylene group, an ether group, a thioether group, a carbonyl group, an ester group, an amide group, a sulfonamide group, an urethane group, and an urea group. The alkylene group mentioned above can be a group represented by a following formula:

$$-[C(R_b)(R_c)]_r-$$

wherein $R_b$ and $R_c$ each represents a hydrogen atom, an alkyl group, a halogen atom, a hydroxyl group, or an alkoxy group, and may be mutually same or different. The alkyl group is preferably a lower alkyl group such as a methyl group, an ethyl group, a propyl group, an isopropyl group or a butyl group, and is more preferably selected from a methyl group, an ethyl group, a propyl group and an isopropyl group. The alkoxy group preferably has 1 to 4 carbon atoms, such as a methoxy group, an ethoxy group, a propoxy group or a butoxy group. The halogen atom can be a chlorine atom, a bromine atom, a fluorine atom or an iodine atom. The alkyl group or the alkoxy group may have a substituent. A substituent for the alkyl group or the alkoxy group can be, for example, a hydroxyl group, a halogen atom or an alkoxy group (preferably 1 to 4 carbon atoms). r indicates an integer of 1 to 10.

(pI)

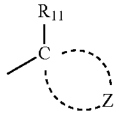

(pII)

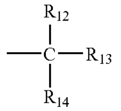

(pIII)

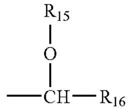

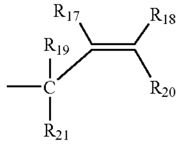

(pV)

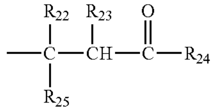

In formulae (pI) to (pV):

$R_{11}$ represents an alkyl group; and Z represents an atomic group necessary for forming an alicyclic hydrocarbon group together with a carbon atom;

$R_{12}$ to $R_{16}$ each independently represents an alkyl group or an alicyclic hydrocarbon group, provided that at least one of $R_{12}$ to $R_{14}$, or either of $R_{15}$ and $R_{16}$ represents an alicyclic hydrocarbon group;

$R_{17}$ to $R_{21}$ each independently represents a hydrogen atom, an alkyl group or an alicyclic hydrocarbon group, provided that at least one of $R_{17}$ to $R_{21}$ represents an alicyclic hydrocarbon group, and either of $R_{19}$ and $R_{21}$ represents an alkyl group or alicyclic hydrocarbon group; and $R_{22}$ to $R_{25}$ each independently represents an alkyl group or an alicyclic hydrocarbon group, provided that at least one of $R_{22}$ to $R_{25}$ represents an alicyclic hydrocarbon group, and $R_{23}$ and $R_{24}$ may be mutually bonded to form a ring.

In formulae (pI) to (pV), an alkyl group in $R_{12}$ to $R_{25}$ is a substituted or non-substituted linear or branched alkyl group with 1 to 4 carbon atoms. Examples of such alkyl group include a methyl group, an ethyl group, an n-propyl group, an isopropyl group, an n-butyl group, an isobutyl group, a sec-butyl group and a t-butyl group.

Such alkyl group may be further substituted, and examples of such substituent include an alkoxy group with 1 to 4 carbon atoms, a halogen atom (fluorine atom, chlorine atom, bromine atom or iodine atom), an acyl group, an acyloxy group, a cyano group, a hydroxyl group, a carboxyl group, an alkoxycarbonyl group and a nitro group.

The alicyclic hydrocarbon group in $R_{11}$ to $R_{25}$ or the alicyclic hydrocarbon group formed by Z and carbon atoms may be monocyclic or polycyclic. Specific examples include a group having a monocyclo, bicyclo, tricyclo, or tetracyclo structure with 5 or more carbon atoms. Such group preferably has 6 to 30 carbon atoms, particularly preferably 7 to 25 carbon atoms. Such alicyclic hydrocarbon group may have a substituent.

In the following, structural examples of an alicyclic part (alicyclic structure) in the alicyclic hydrocarbon group are shown.

(1)

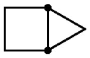

(2)

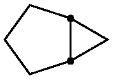

(3)

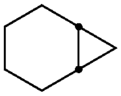

(4)

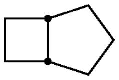

(5)

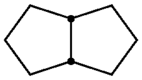

(6)

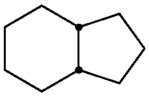

(7)

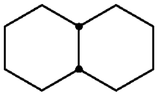

(8)

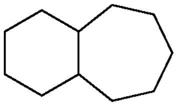

(9)

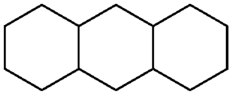

-continued (10)

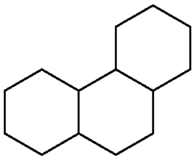

(11)

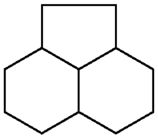

(12)

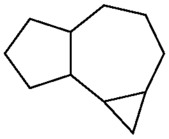

(13)

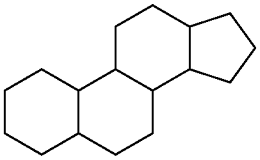

(14)

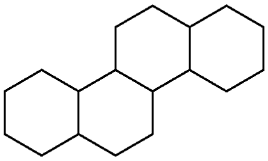

(15)

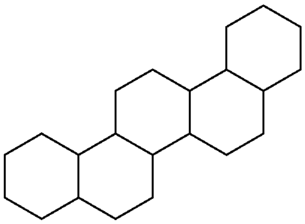

(16)

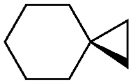

(17)

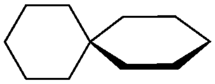

(19)

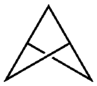

(20)

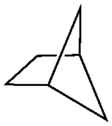

-continued
(21)
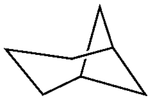
(22)
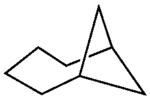
(23)
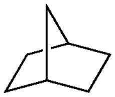
(24)
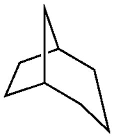
(25)
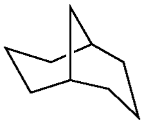
(26)
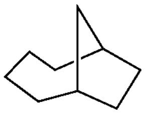
(27)
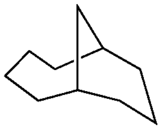
(28)
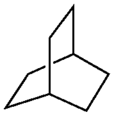
(29)
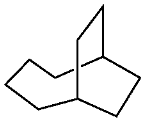
(30)
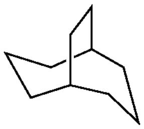
(31)
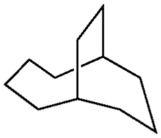
(32)
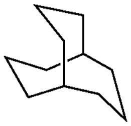
-continued
(33)
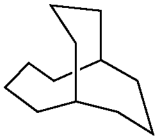
(34)
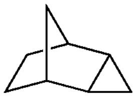
(35)
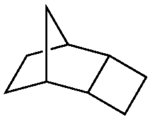
(36)
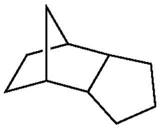
(37)
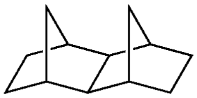
(38)
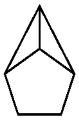
(39)
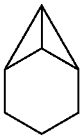
(40)
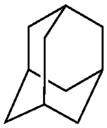
(41)
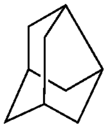
(42)
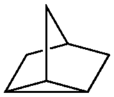
(43)
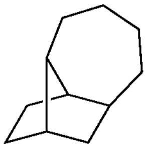
(44)
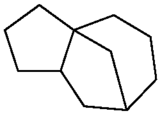

-continued (45)

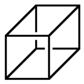

(46)

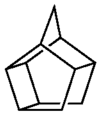

(47)

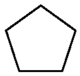

(48)

(49)

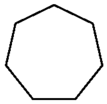

(50)

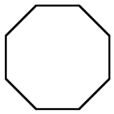

In the invention, the alicyclic part can preferably be an adamantyl group, a noradamantyl group, a decaline residue, a tricyclodecanyl group, a tetracyclodecanyl group, a norbornyl group, a cedrol group, a cyclohexyl group, a cycloheptyl group, a cyclooctyl group, a cyclodecanyl group, or a cyclododecanyl group. It is more preferably an adamantyl group, a decaline residue, a norbornyl group, a cedrol group, a cyclohexyl group, a cycloheptyl group, a cyclooctyl group, a cyclodecanyl group, a cyclododecanyl group, or a tricyclodecanyl group.

A substituent for such alicyclic hydrocarbon group can be an alkyl group, a halogen atom, a hydroxyl group, an alkoxy group, a carboxyl group, or an alkoxycarbonyl group.

The alkyl group is preferably a lower alkyl group such as a methyl group, an ethyl group, a propyl group, an isopropyl group or a butyl group, and more preferably a substituent selected from a methyl group, an ethyl group, a propyl group, and an isopropyl group. The alkoxy group can be that having 1 to 4 carbon atoms, such as a methoxy group, an ethoxy group, a propoxy group or a butoxy group. The alkyl group or the alkoxy group may have a substituent. The substituent of the alkyl group or alkoxy group can for example be a hydroxyl group, a halogen atom or an alkoxy group.

In the repeating unit represented by formula (2), there is preferred a group in which A is a single bond and ALG is a group represented by a formula (pI) or (pII).

For achieving low variation of a pattern size in the observation under a scanning electron microscope (SEM resistance), there is particularly preferred a repeating unit in the formula (2) in which A is a single bond and ALG is a group represented by a following formula:

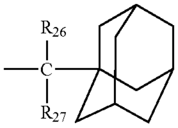

$R_{26}$ and $R_{27}$ each independently represents a linear or branched alkyl group with 1 to 4 carbon atoms.

In the following, there are shown specific examples of the repeating unit (a) represented by the formula (1), but the present invention is not limited to such examples.

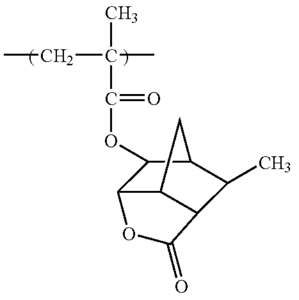

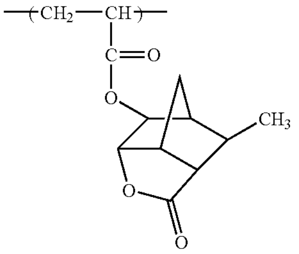

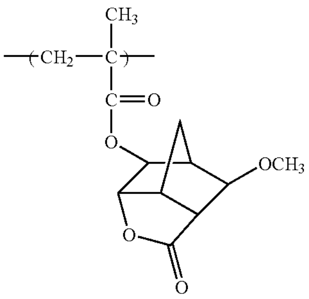

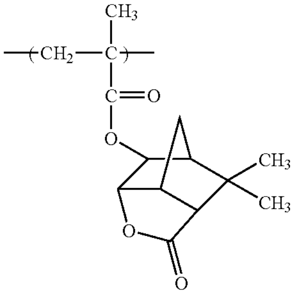

-continued
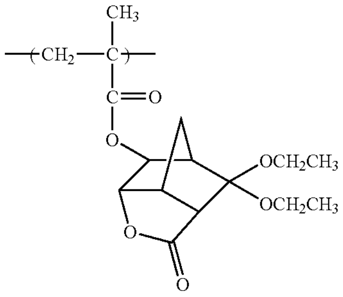
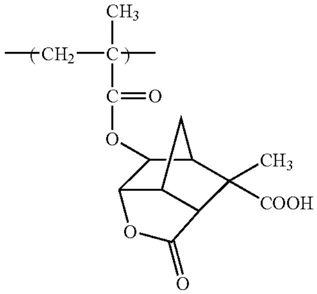
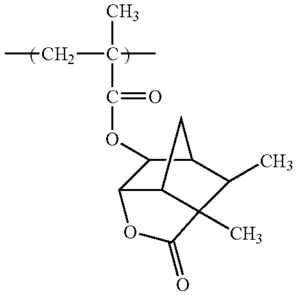
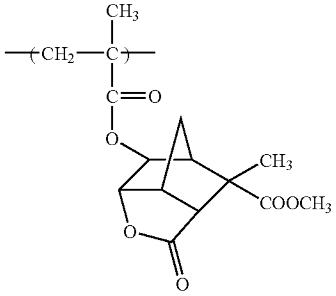
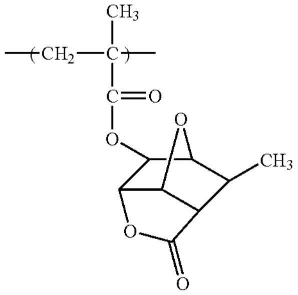
-continued
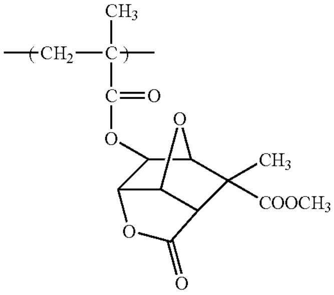
In the following, there are shown specific examples of the monomer corresponding to the repeating unit (b) in formula (2), but the present invention is not limited to such examples.
1
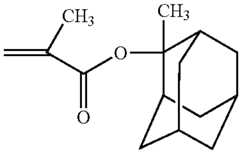
2
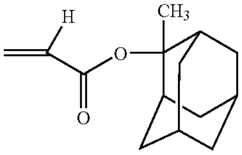
3
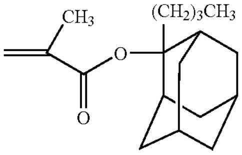
4
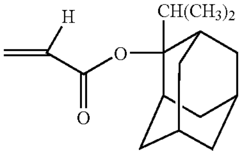
5
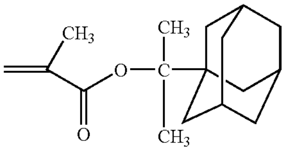
6
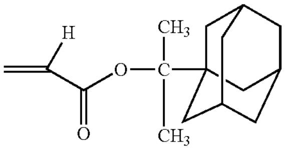
7
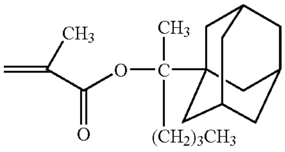

-continued
8
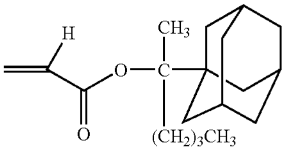
9
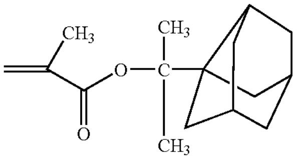
10
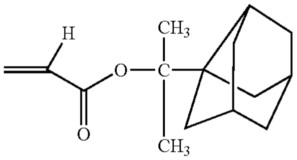
11
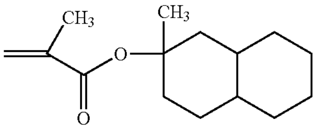
12
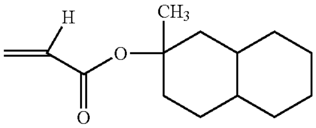
13
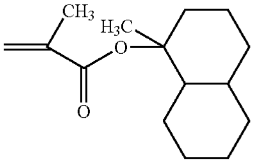
14
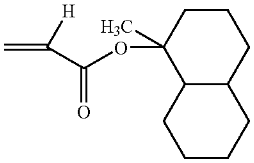
15
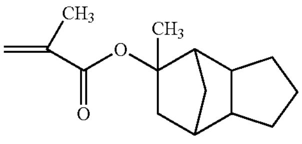
16
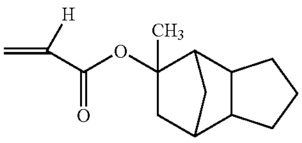
17
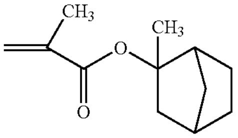
-continued
18
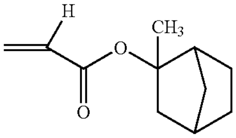
19
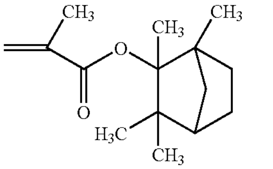
20
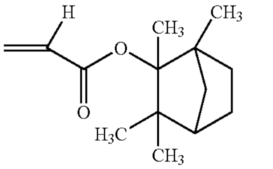
21
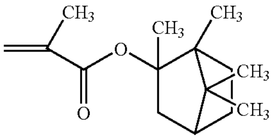
22
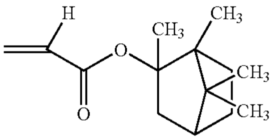
23
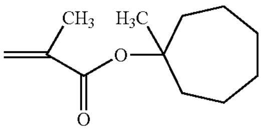
24
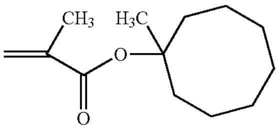
25
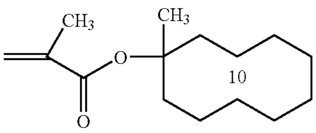
26
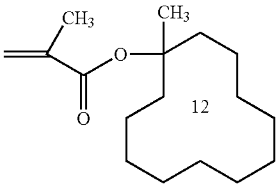

-continued
27
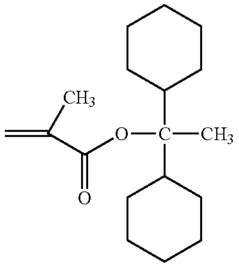
28
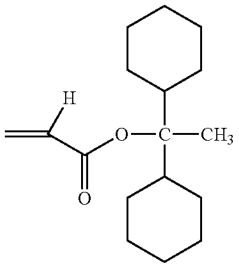
29
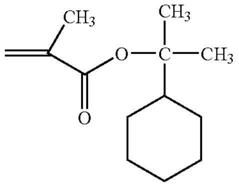
30
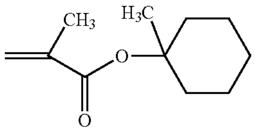
31
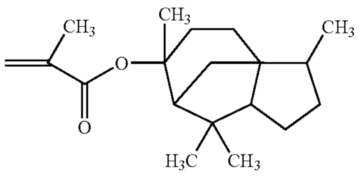
32
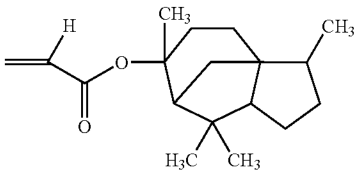
33
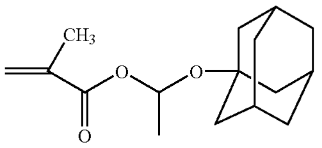
34
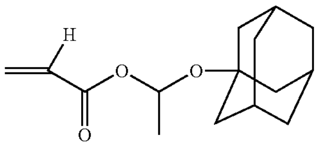
-continued
35
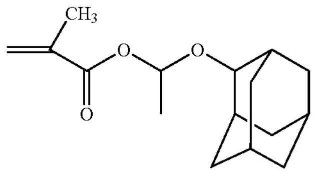
36
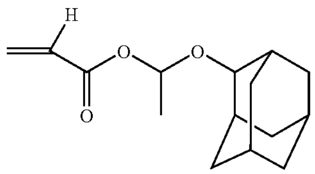
37
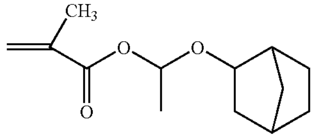
38
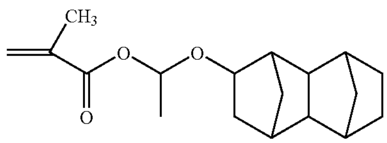
39
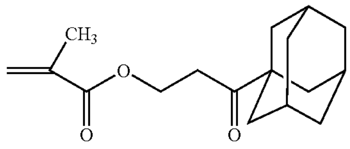
40
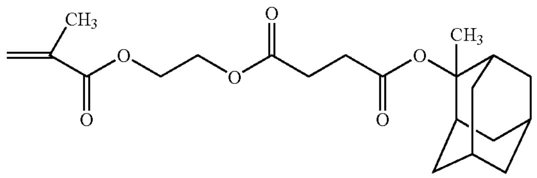
41
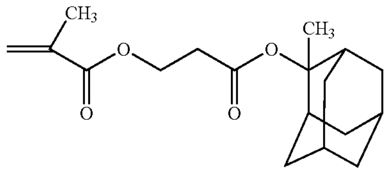
The resin (A) preferably includes, in addition to the repeating unit represented by the formula (1) and the repeating unit represented by the formula (2), a repeating unit (c) having a partial structure substituted by an alicyclic hydrocarbon group represented by a following formula (3), in order to further improving the LWR characteristics.
(3)
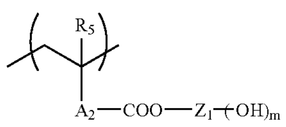

In the formula (3):

$R_5$ represents a hydrogen atom or an alkyl group;

$Z_1$ represents an (m+1)-valent alicyclic hydrocarbon group;

$A_2$ represents a single bond or a divalent connecting group; and m represents an integer of 1 to 3.

Thus, $-Z_1-(OH)_m$ represents an aliphatic cyclic hydrocarbon group in which m hydroxyl groups are substituted.

A divalent connecting group represented by $A_2$ can be similar to the divalent connecting group in the aforementioned formulae (1) and (2).

An aliphatic cyclic hydrocarbon group (alicyclic group) $Z_1$ can be similar to the aforementioned aliphatic cyclic hydrocarbon group (alicyclic group).

Hydroxyl groups of m units may be substituted on the aliphatic ring itself of $Z_3$, or a substituent on the aliphatic ring.

As the repeating unit represented by formula (3), a repeating unit represented by the following formula (Ia) is preferable for a resolution and a profile in a line pattern formation.

(Ia)

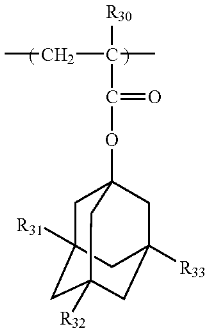

In the formula (Ia), $R_{30}$ represents a hydrogen atom or a methyl group.

$R_{31}$ to $R_{33}$ each independently represents a hydrogen atom, a hydroxyl group or an alkyl group, provided that at least one of $R_{31}$ to $R_{33}$ represents a hydroxyl group.

It is further preferable, in the repeating unit represented by the formula (Ia), that two within $R_{31}$ to $R_{33}$ are hydroxyl groups.

In the following, there are shown specific examples of the repeating unit represented by formula (3), but the present invention is not limited to such examples.

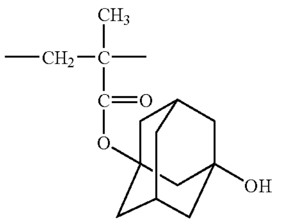

-continued

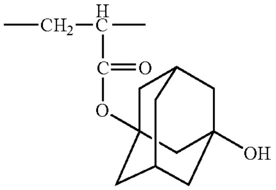

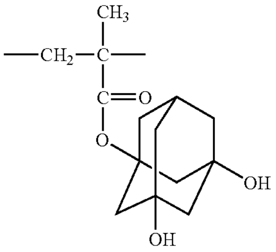

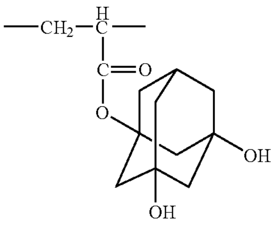

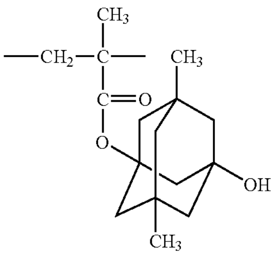

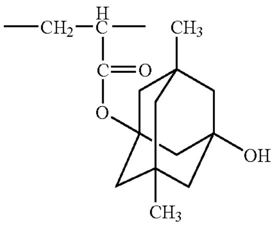

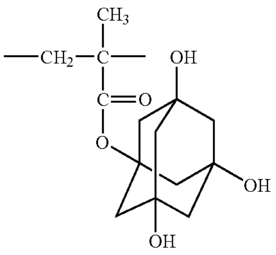

-continued
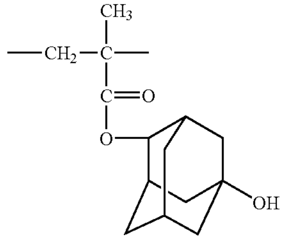
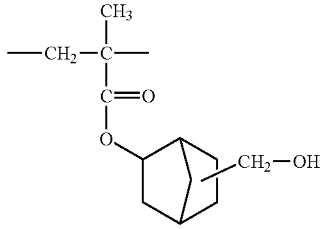
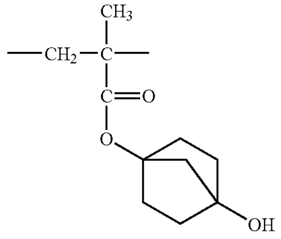
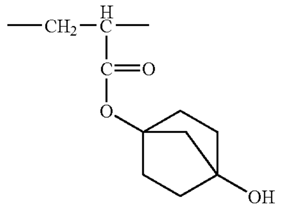
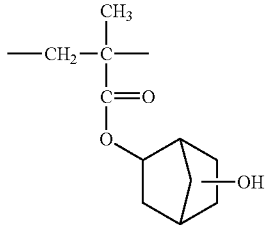
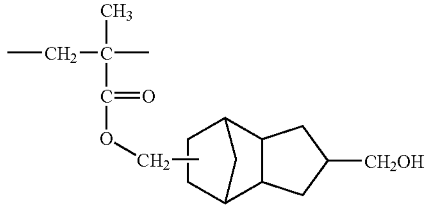
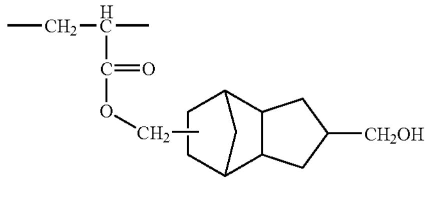
-continued
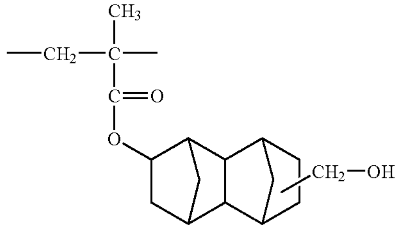
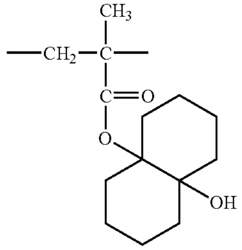
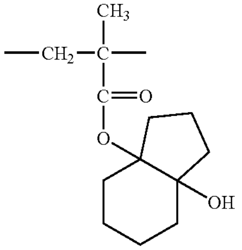
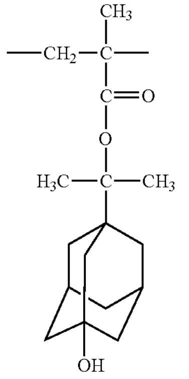
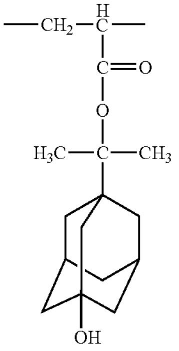
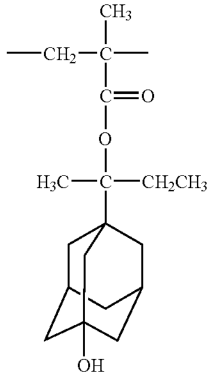
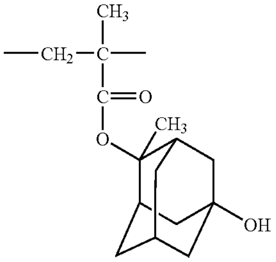
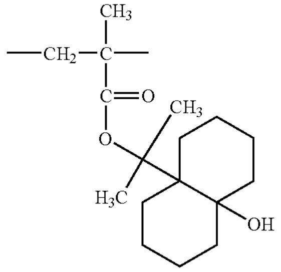
<Other Repeating Unit Having Alicyclic Lactone Structure>
The resin (A) may contain, in addition to the aforementioned lactone structure, a repeating unit (d) having an alicyclic lactone structure. In this manner, there can be expected an effect for improving an ability of suppressing a pattern tumbling and an effect for suppressing a SEM shrinkage (shrinkage of pattern size in the observation under a scanning electron microscope).

A repeating unit having an alicyclic lactone structure can be, for example, a repeating unit including cyclohexanelactone, norbornanelactone or adamantanelactone.

For example, a repeating unit having norbornanelactone can be a (meth)acryl repeating unit having a group represented by following formulae (a-1) to (a-3), a repeating unit having cyclohexanelactone can be a (meth)acryl repeating unit having a group represented by following formulae (a-4) and (a-5), and a repeating unit having adamantanelactone can be a (meth)acryl repeating unit having a group represented by a following formula (VI).

There is particularly preferred a (meth)acryl repeating unit having a group represented by following formulae (a-1) to (a-3).

(a-1)

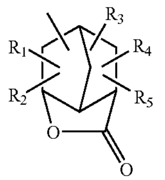

(a-2)

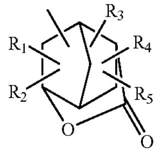

(a-3)

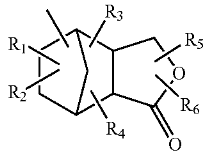

(a-4)

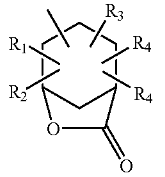

(a-5)

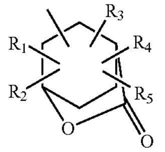

In formulae (a-1) to (a-5), $R_1$ to $R_6$ each independently represents a hydrogen atom, an alkyl group, a cycloalkyl group, an alkenyl group, or —COORa, wherein Ra represents an alkyl group, and two within $R_1$ to $R_6$ may be mutually bonded to form a ring.

A case in which each of $R_1$ to $R_6$ is a hydrogen atom means a non-substituted state. For example the cyclic structure in the formula (a-1) may have five substituents (alkyl group, cycloalkyl group or alkenyl group) at maximum as $R_1$ to $R_5$.

An alkyl group as $R_1$ to $R_6$ or Ra is a linear or branched alkyl group that may have a substituent.

The linear or branched alkyl group is preferably a linear or branched alkyl group with 1 to 12 carbon atoms, more preferably a linear or branched alkyl group with 1 to 10 carbon atoms, and further preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group or a decyl group.

A cycloalkyl group as $R_1$ to $R_6$ may have a substituent, and preferably includes 3 to 8 carbon atoms, such as a cyclopropyl group, a cyclopentyl group, a cyclohexyl group, a cycloheptyl group or a cyclooctyl group.

An alkenyl group as $R_1$ to $R_6$ may have a substituent, and preferably includes 2 to 6 carbon atoms, such as a vinyl group, a propenyl group, a butenyl group or a hexenyl group.

Also a ring formed by bonding of two within $R_1$ to $R_6$ can be a 3- to 8-membered ring such as a cyclopropane ring, a cycylobutane ring, a cyclopentane ring, a cyclohexane ring, or a cyclooctane ring.

$R_1$ to $R_6$ in formulae (a-1) to (a-5) may be bonded to any of carbon atoms constituting the cyclic skeleton.

Also a substituent that may be present on the alkyl group, cycloalkyl group or alkenyl group can be an alkoxy group with 1 to 4 carbon atoms, a halogen atom (fluorine atom, chlorine atom, bromine atom or iodine atom), an acyl group with 2 to 5 carbon atoms, an acyloxy group with 2 to 5 carbon atoms, a cyano group, a hydroxyl group, a carboxyl group, an alkoxycarbonyl group with 2 to 5 carbon atoms or a nitro group.

A repeating unit having a group represented by formulae (a-1) to (a-5) can be a repeating unit represented by a following formula (V).

(V)

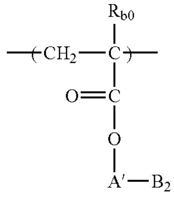

In formula (V), $R_{b0}$ represents a hydrogen atom, a halogen atom, or a substituted or non-substituted alkyl group with 1 to 4 carbon atoms.

A preferred substituent that may be present on $R_{b0}$ can be similar to those that may be present on the alkyl group as $R_1$ in the formulae (a-1) to (a-5).

A halogen atom as $R_{b0}$ can be a fluorine atom, a chlorine atom, a bromine atom or an iodine atom. $R_{b0}$ is preferably a hydrogen atom.

A' represents a single bond, an ether group, an ester group, a carbonyl group, an alkylene group or a divalent group formed by a combination thereof.

$B_2$ represents a group indicated by any of the formulae (a-1) to (a-5). In A', the divalent group formed by the aforementioned combination can be, for example, those represented by following formulae:

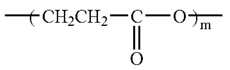

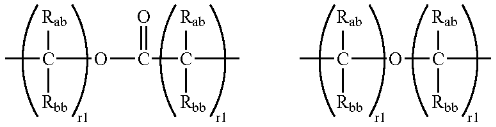

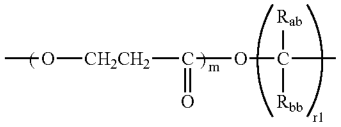

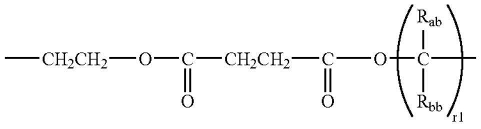

In these formulae, $R_{ab}$ and $R_{bb}$ each represents a hydrogen atom, an alkyl group, a halogen atom, a hydroxyl group, and an alkoxy group, and both may be same or different.

The alkyl group is preferably a lower alkyl group such as a methyl group, an ethyl group, a propyl group, an isopropyl group or a butyl group, and is more preferably selected from a methyl group, an ethyl group, a propyl group, and an isopropyl group. The alkoxy group can be a group having 1 to 4 carbon atoms, such as a methoxy group, an ethoxy group, a propoxy group or a butoxy group. The halogen atom can be a chlorine atom, a bromine atom, a fluorine atom or an iodine atom. The alkyl group or alkoxy group may have a substituent. A substituent on the alkyl group or the alkoxy group can be, for example, a hydroxyl group, a halogen atom, or an alkoxy group with 1 to 4 carbon atoms. r1 represents an integer of 1 to 10, and m represents an integer of 1 to 3, preferably 1 or 2.

In the following, there are shown specific examples of the repeating unit represented by formula (V), but the present invention is not limited to such examples.

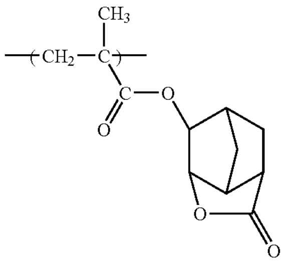

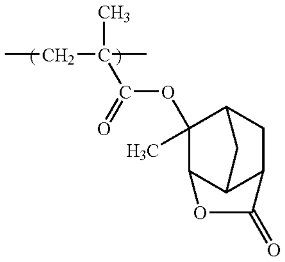

-continued

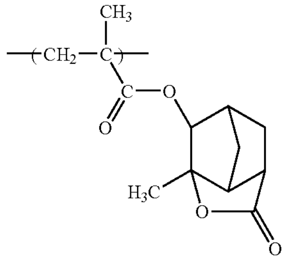

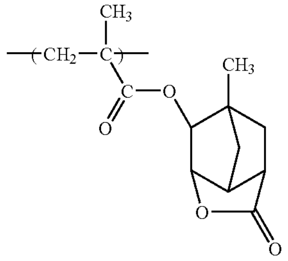

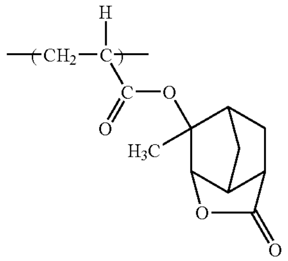

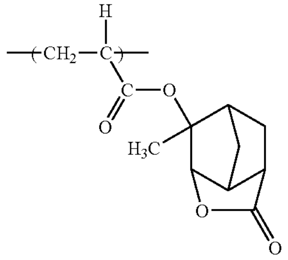

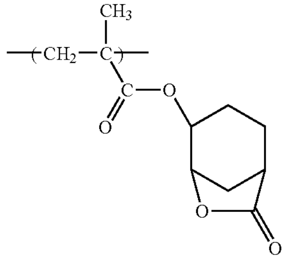

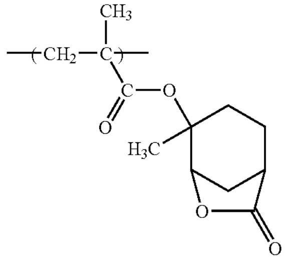

-continued
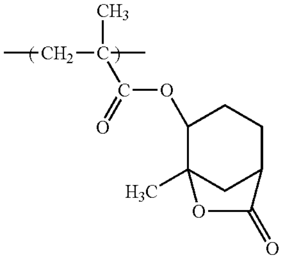
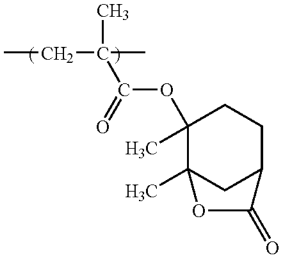
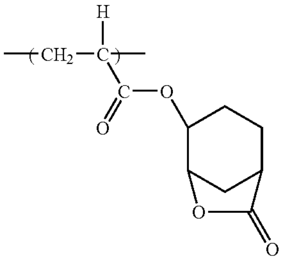
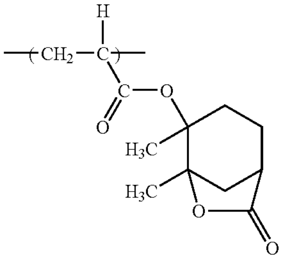
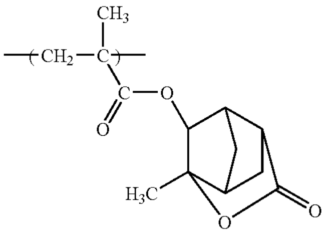
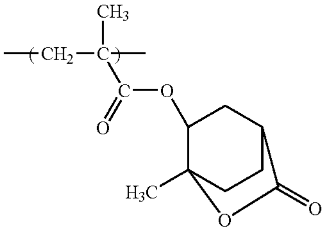
-continued
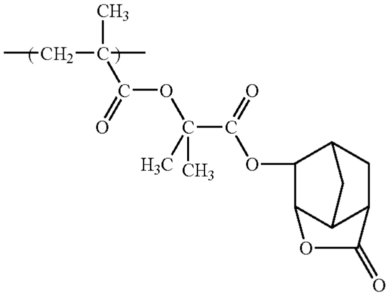
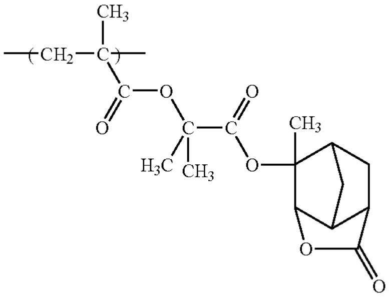
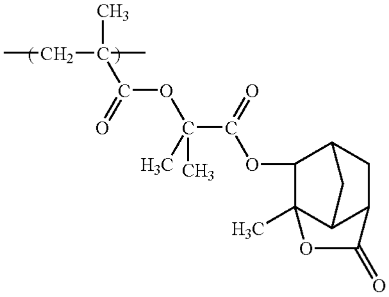
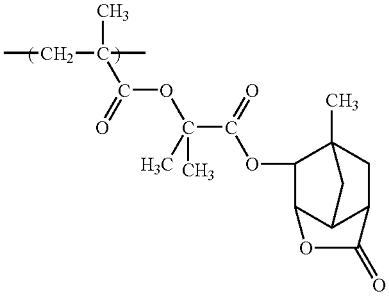
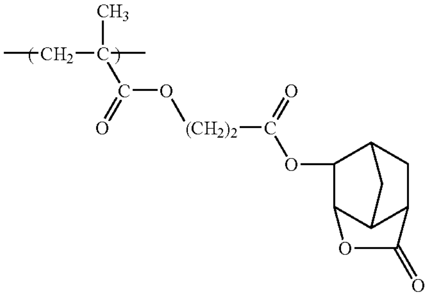

-continued
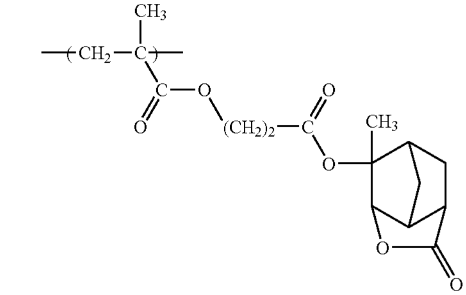
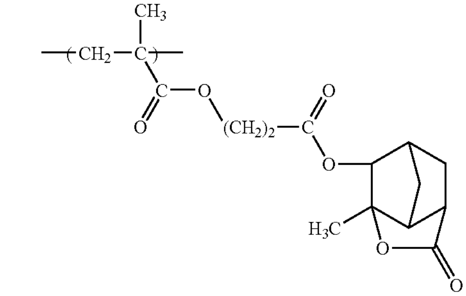
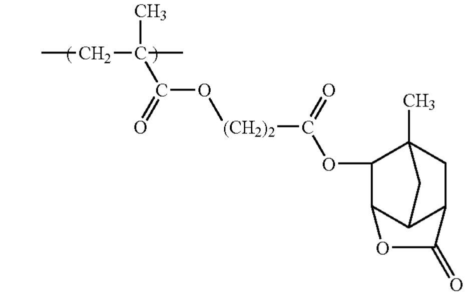
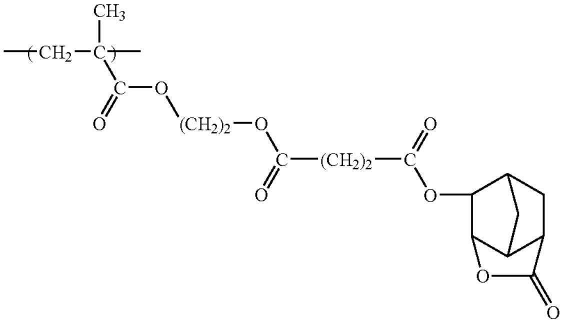
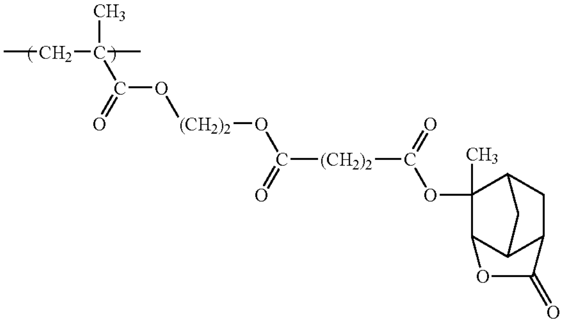
-continued
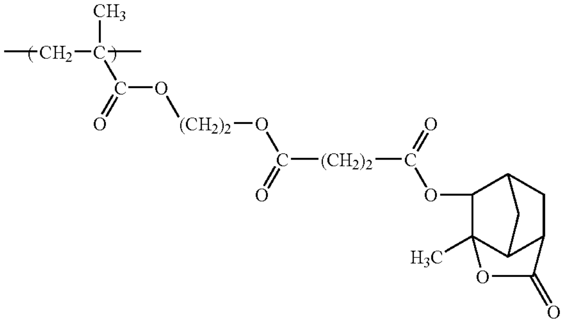
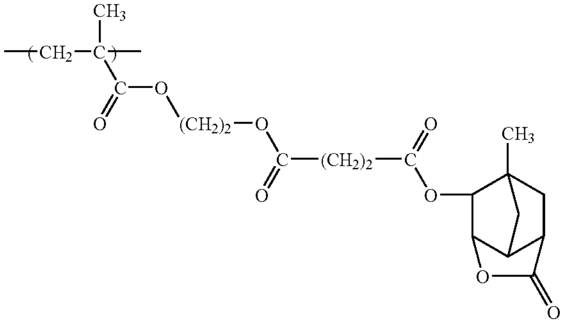
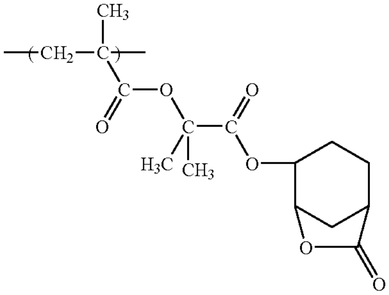
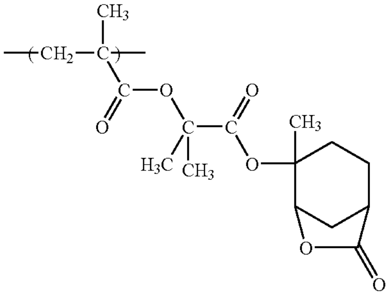
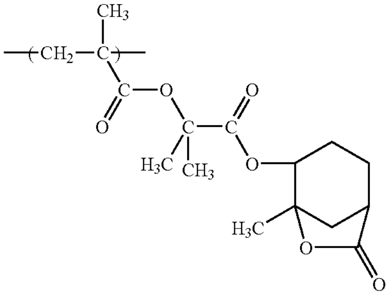

-continued
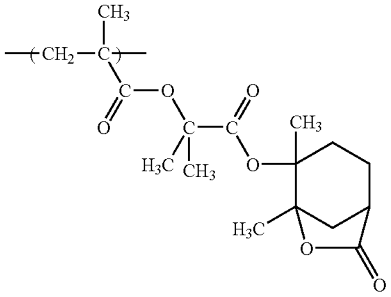
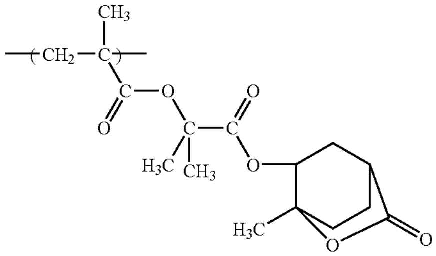
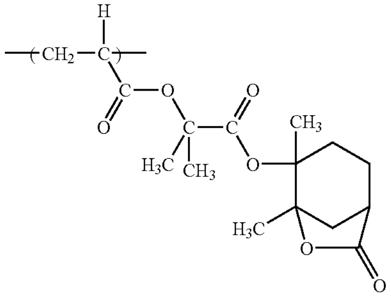
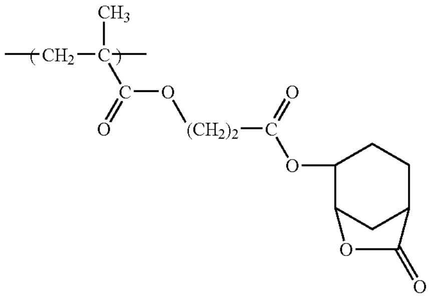
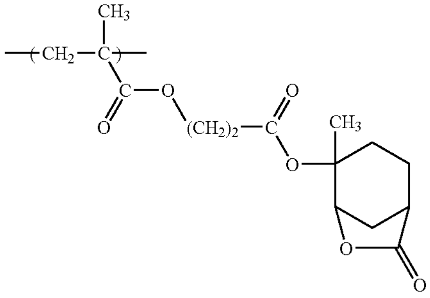
-continued
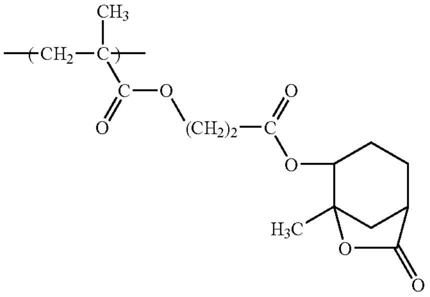
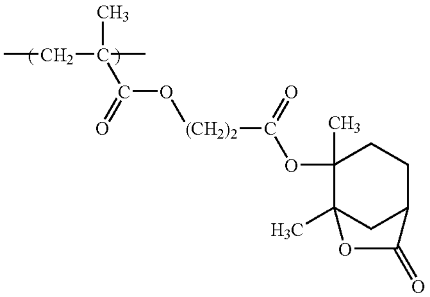
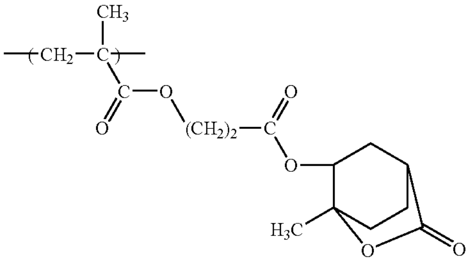
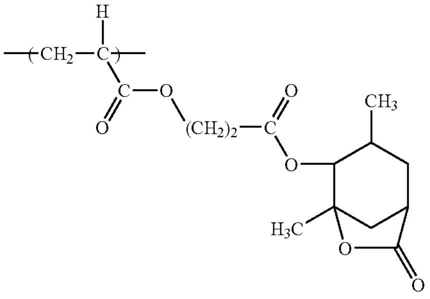
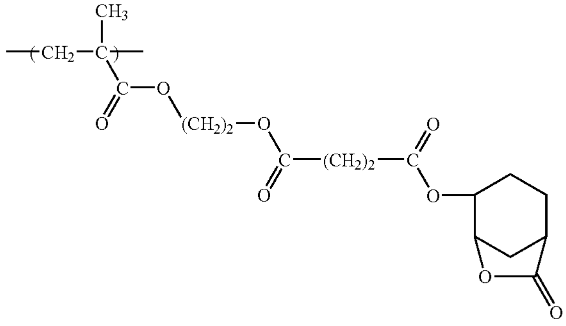

-continued

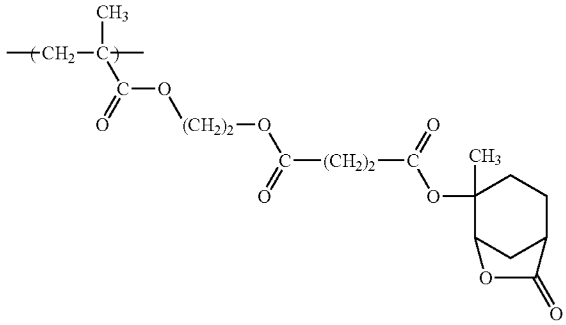

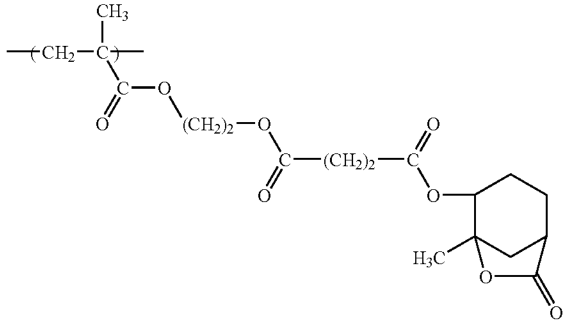

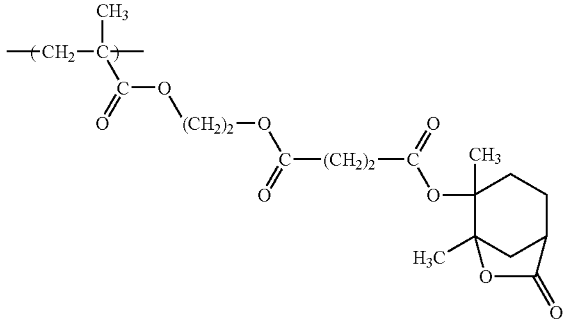

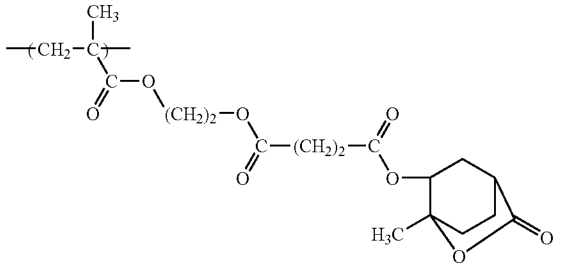

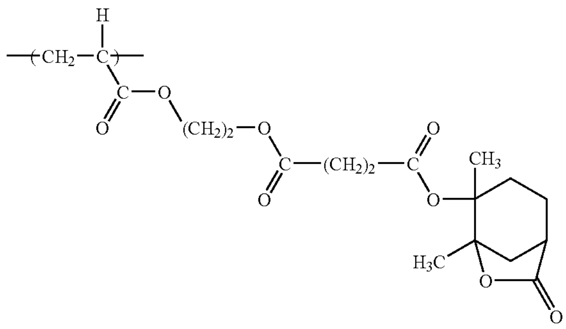

-continued

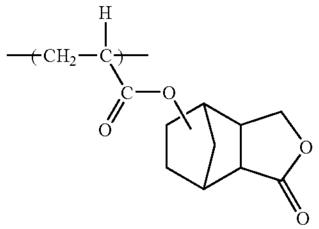

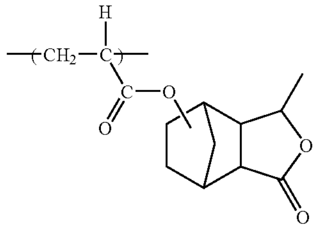

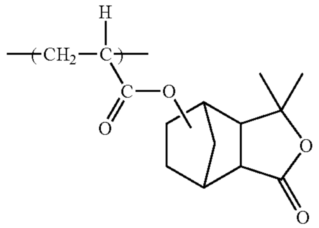

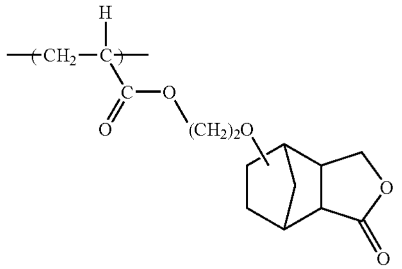

A repeating unit including adamantanelactone can be that represented by a following formula (VI):

(VI)

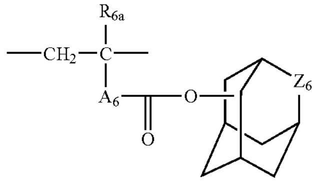

$Z_6$: 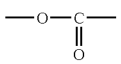 or 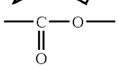

In formula (VI), $A_6$ represents a single group or a combination of two or more groups, selected from a single bond, an alkylene group, a cycloalkylene group, an ether group, a thioether group, a carbonyl group, and an ester group.

$R_{6a}$ represents a hydrogen atom, an alkyl group with 1 to 4 carbon atoms, a cyano group or a halogen atom.

In formula (VI), the alkylene group as $A_6$ can be a group represented by a following formula:

$$—[C(R_{nf})(R_{ng})]_r—$$

wherein $R_{nf}$ and $R_{ng}$ each represents a hydrogen atom, an alkyl group, a halogen atom, a hydroxyl group, or an alkoxy group, and they may be mutually same or different.

The alkyl group is preferably a lower alkyl group such as a methyl group, an ethyl group, a propyl group, an isopropyl group or a butyl group, and is more preferably selected from a methyl group, an ethyl group, a propyl group and an isopropyl group. The alkoxy group can be a group with 1 to 4 carbon atoms such as a methoxy group, an ethoxy group, a propoxy group or a butoxy group. The alkyl group or the alkoxy group may have a substituent. A substituent on the alkyl group or the alkoxy group can be, for example, a hydroxyl group, a halogen atom, or an alkoxy group. The halogen atom can be, for example, a chlorine atom, a bromine atom, a fluorine atom or an iodine atom. r represents an integer of 1 to 10.

In formula (VI), a cycloalkylene group as $A_6$ can be a group with 3 to 10 carbon atoms, such as a cyclopentylene group, a cyclohexylene group or a cyclooctylene group.

A bridged alicyclic structure containing $Z_6$ may have a substituent. The substituent can be, for example, a halogen atom, an alkoxy group (preferably with 1 to 4 carbon atoms), an alkoxycarbonyl group (preferably with 1 to 5 carbon atoms), an acyl group (such as a formyl group, or a benzoyl group), an acyloxy group (such as a propylcarbonyloxy group or a benzoyloxy group), an alkyl group (preferably with 1 to 4 carbon atoms), a carboxyl group, a hydroxyl group or an alkylsulfonylsulfamoyl group (such as $—CONHSO_2CH_3$). The alkyl group as a substituent may be further substituted with a hydroxyl group, a halogen atom, or an alkoxy group (preferably with 1 to 4 carbon atoms).

In formula (VI), an oxygen atom of an ester group bonded to $A_6$ may be bonded to any one of the carbon atoms constituting the bridged alicyclic structure containing $Z_6$.

In the following, there are shown specific examples of the repeating unit represented by formula (VI), but the present invention is not limited to such examples.

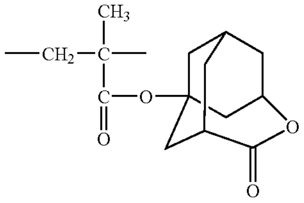

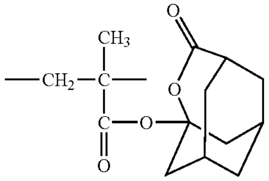

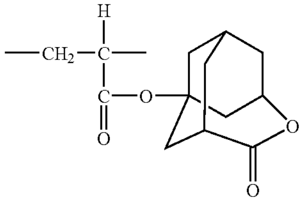

-continued

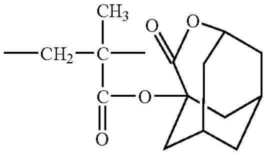

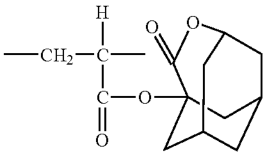

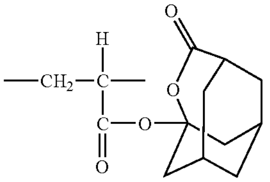

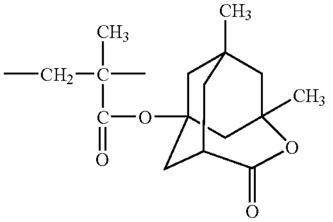

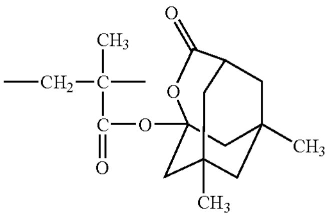

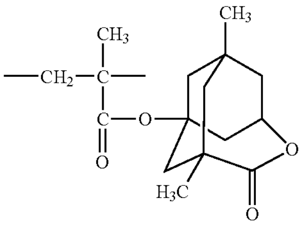

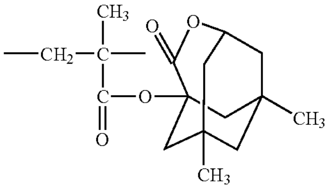

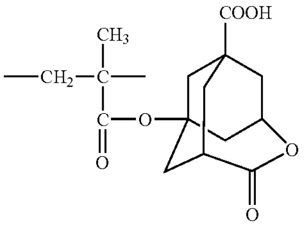

-continued

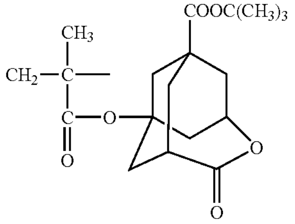

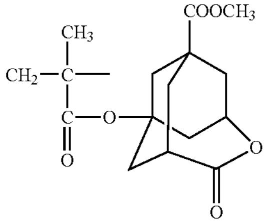

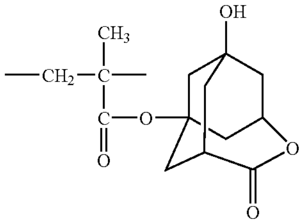

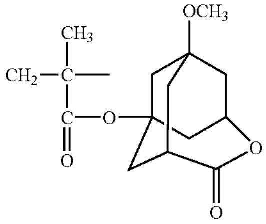

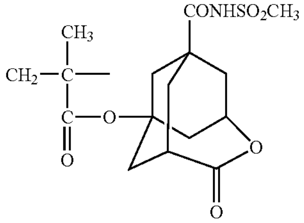

<Methacrylic Acid Repeating Unit>

The resin (A) of the invention may further include a methacrylic acid repeating unit (e). The methacrylic acid repeating unit in the invention is a repeating unit represented by a following formula:

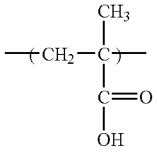

The resin (A) may further include a repeating unit having a lactone structure represented by a following formula (IV).

(IV)

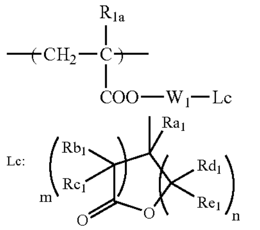

In formula (IV), $R_{1a}$ represents a hydrogen atom or a methyl group.

$W_1$ represents a single group or a combination of two or more groups, selected from a single bond, an alkylene group, an ether group, a thioether group, a carbonyl group and an ester group.

$R_{a1}$, $R_{b1}$, $R_{c1}$, $R_{d1}$ and $R_{e1}$ each independently represents a hydrogen atom or an alkyl group with 1 to 4 carbon atoms; m and n each independently represents an integer of 0 to 3, wherein m+n is 2 or larger and 6 or smaller.

An alkyl group with 1 to 4 carbon atoms as $R_{a1}$ to $R_{e1}$ can be a methyl group, an ethyl group, a propyl group, an isopropyl group, an n-butyl group, an isobutyl group, a sec-butyl group or a t-butyl group.

In formula (IV), the alkylene group as $W_1$ can be a group represented by a following formula:

$$—[C(R_f)(R_g)]_{r1}—$$

wherein $R_f$ and $R_g$ each represents a hydrogen atom, an alkyl group, a halogen atom, a hydroxyl group, or an alkoxy group, and they may be mutually same or different.

The alkyl group is preferably a lower alkyl group such as a methyl group, an ethyl group, a propyl group, an isopropyl group or a butyl group, and is more preferably selected from a methyl group, an ethyl group, a propyl group and an isopropyl group. The alkoxy group can be a group with 1 to 4 carbon atoms such as a methoxy group, an ethoxy group, a propoxy group or a butoxy group. The halogen atom can be, for example, a chlorine atom, a bromine atom, a fluorine atom or an iodine atom. r1 represents an integer of 1 to 10.

The alkyl group or the alkoxy group may have a substituent. A substituent on the alkyl group or the alkoxy group can be, for example, a carboxyl group, an acyloxy group, a cyano group, a halogen atom, a hydroxyl group, an alkoxy group, acetylamide group, an alkoxycarbonyl group or an acyl group.

In the following, there are shown specific examples of a monomer corresponding to the repeating unit represented by formula (IV), but the present invention is not limited to such examples.

(IV-1)

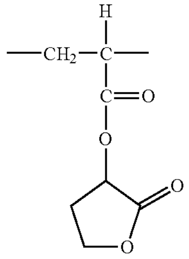

-continued
(IV-2)
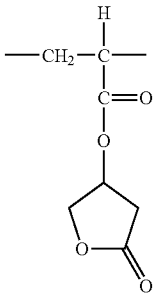
(IV-3)
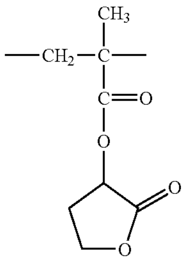
(IV-4)
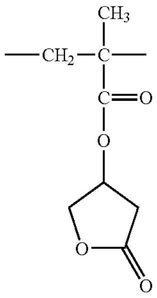
(IV-5)
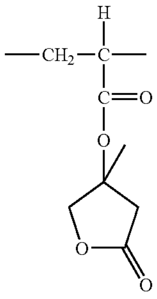
(IV-6)
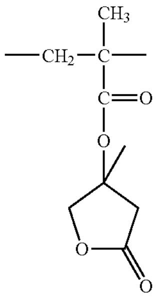
-continued
(IV-7)
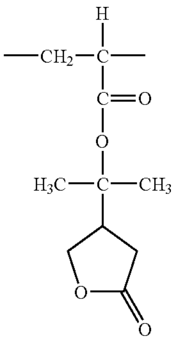
(IV-8)
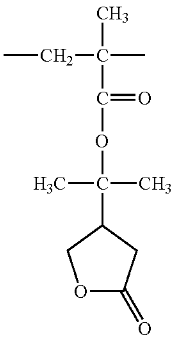
(IV-9)
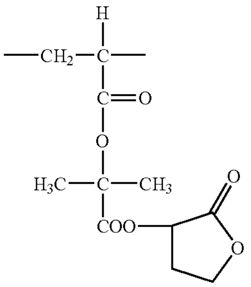
(IV-10)
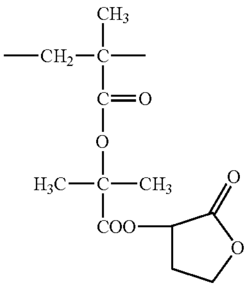
(IV-11)
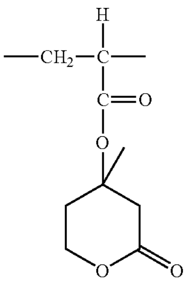

-continued
(IV-12)
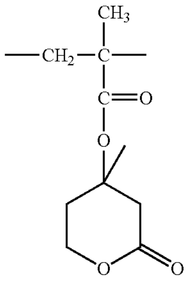
(IV-13)
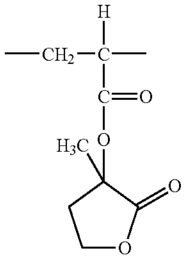
(IV-14)
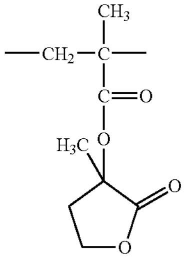
(IV-15)
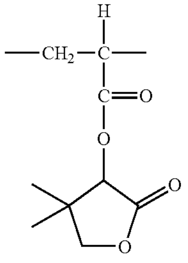
(IV-16)
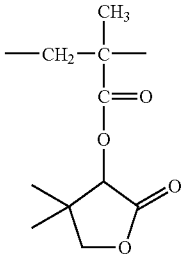
-continued
(IV-17)
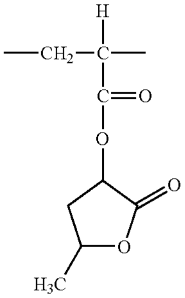
(IV-18)
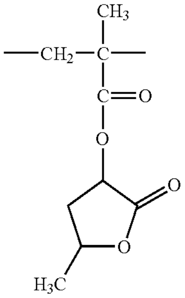
(IV-19)
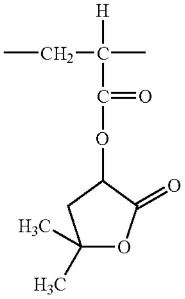
(IV-20)
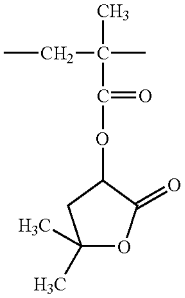
(IV-21)
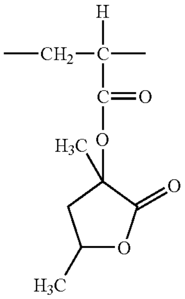

-continued
(IV-22)
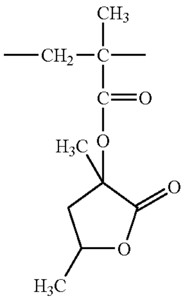
(IV-23)
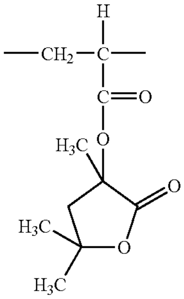
(IV-24)
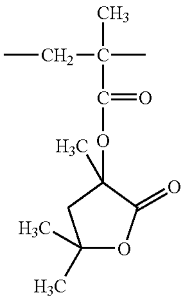
(IV-25)
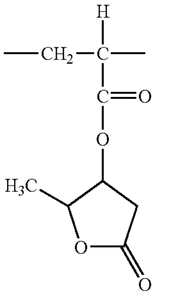
(IV-26)
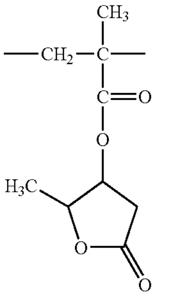
-continued
(IV-27)
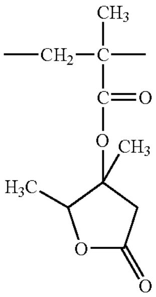
(IV-28)
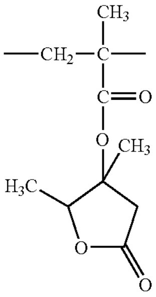
(IV-29)
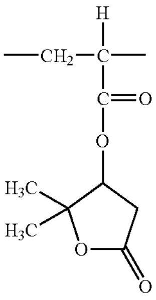
(IV-30)
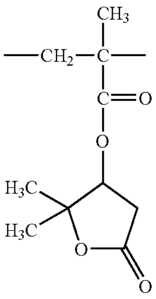
(IV-31)
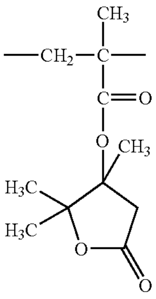

-continued (IV-32)

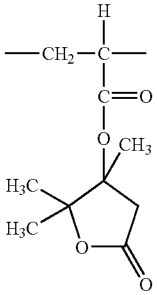

(IV-33)

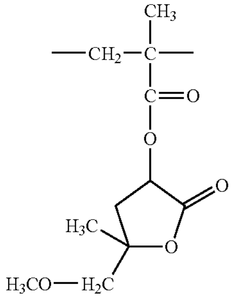

(IV-34)

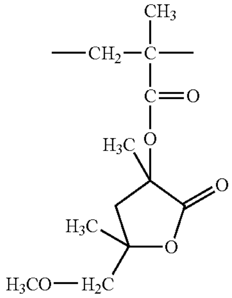

(IV-35)

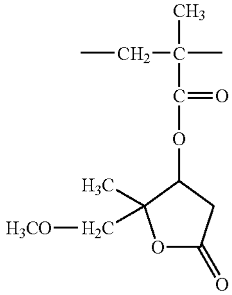

(IV-36)

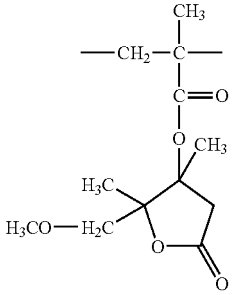

In the specific examples of the structure of formula (IV), those (IV-17) to (IV-36) are preferred for providing a better exposure margin.

In addition, there can also be included a repeating unit having a lactone ring, described in JP-A Nos. 2004-101642, 2003-113174, 2003-147023, 2002-308866, 2002-371114, 2003-64134 and 2003-270787.

As such repeating unit, there can be employed, more specifically, a repeating unit having a lactone structure represented by following formulae:

(i)

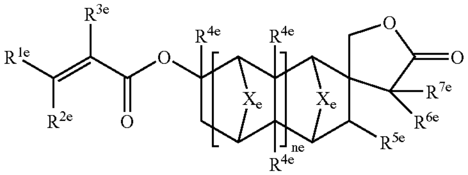

(ii)

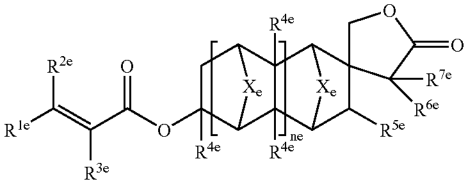

(iii)

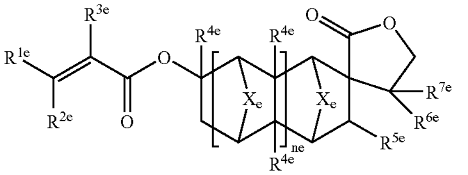

(iv)

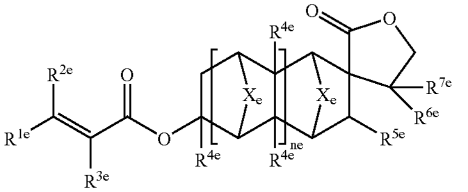

In formulae (i) to (iv), $R^{1e}$ to $R^{7e}$ each independently represents a hydrogen atom, an alkyl group or a cycloalkyl group; $X_e$ represents a methylene group or an ethylene group that may be substituted with an alkyl group with 1 to 8 carbon atoms, an oxygen atom or a sulfur atom; and $n_e$ represents 0 or a positive integer.

In formulae (i) to (iv), an alkyl group or an cycloalkyl group as $R^{1e}$ to $R^{7e}$ generally has a number of carbon atoms of 1 to 20, preferably 1 to 8, more preferably 1 to 4 and further preferably 1 or 2. More specifically it can be a methyl group, an ethyl group, an n-propyl group, an isopropyl group, an isobutyl group, a 2-ethylhexyl group, a cyclohexyl group or a methylcyclohexyl group.

(v)

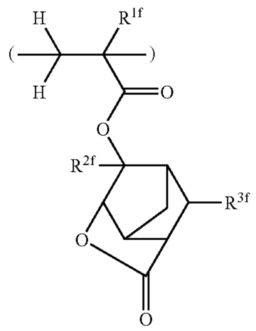

In formula (v), $R^{1f}$ represents a hydrogen atom or a methyl group; $R^{2f}$ represents a hydrogen atom, or an alkyl or cycloalkyl group with 8 carbon atoms or less, specifically such as a methyl group, an ethyl group, a propyl group, an isopropyl group, an n-butyl group, a sec-butyl group, a tert-butyl group, a tert-amyl group, an n-pentyl group, an n-hexyl group, a cyclopentyl group, a cyclohexyl group, a cyclopentylmethyl group, a cyclopentylethyl group, a cyclohexylmethyl group or a cyclohexylethyl group. $R_{3f}$ represents $CO_2R^{4f}$ and $R^{4f}$ represents an alkyl or cycloalkyl group with 15 or less carbon atoms, or a group in which one or plural oxygen atoms are inserted in an arbitrary carbon-carbon bond of such alkyl or cycloalkyl group. The alkyl or cycloalkyl group can be, for example, a methyl group, an ethyl group, a propyl group, an isopropyl group, an n-butyl group, a sec-butyl group, a tert-butyl group, a tert-amyl group, an n-pentyl group, an n-hexyl group, a cyclopentyl group, a cyclohexyl group, an ethylcyclohexyl group, a butylcyclopentyl group, an ethylcyclohexyl group, a butylcyclohexyl group, an adamantyl group, an ethyladamantyl group, or a butyladamantyl group, and a group in which one or plural oxygen atoms are inserted in a carbon-carbon bond can be, for example, a methoxymethyl group, a methoxyethoxy methyl group, 1-ethoxy ethyl group or 2-tetrahydropyranyl group.

(vi)

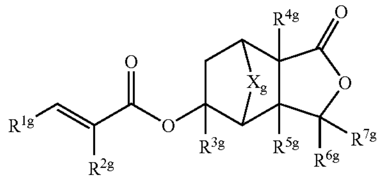

(vii)

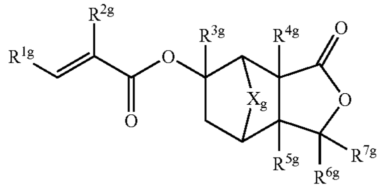

In formulae (vi) and (vii), $R^{1g}$ and $R^{2g}$ each independently represents a hydrogen atom, an alkyl group, a cycloalkyl group or an alkoxycarbonyl group; $R^{3g}$ to $R^{7g}$ each independently represents a hydrogen atom, an alkyl group or a cycloalkyl group; and $X_g$ represents a methylene group, an ethylene group, an oxygen atom or a sulfur atom.

The alkyl group or the cycloalkyl group as $R^{1g}$ to $R^{7g}$ generally has 8 or less carbon atoms, and can be a methyl group, an ethyl group, an n-propyl group, an isopropyl group, an isobutyl group, a 2-ethylhexyl group, a cyclohexyl group or a methylcyclohexyl group. Also in case either of $R^{1g}$ and $R^{2g}$ is an alkoxycarbonyl group, it generally has 2 to 9 carbon atoms, and an alkyl part of the alkoxy group may be linear, branched or cyclic. Preferably $R^{1g}$ is a hydrogen atom, and $R^{2g}$ is a hydrogen atom or a methyl group. Also $R^{3g}$ is preferably a hydrogen atom, a methyl group or an ethyl group, and $R^{4g}$ to $R^{7g}$ are preferably all hydrogen atoms.

A (meth)acrylate compound represented by formula (viii)

(viii)

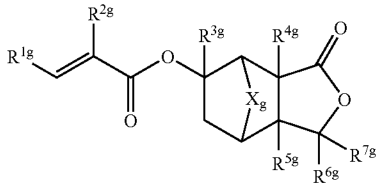

In formula (viii), $R^{1g}$ represents a hydrogen atom or a methyl group; $R^{2g}$ and $R^{3g}$ each independently represents a hydrogen atom or an alkyl or cycloalkyl group with 15 or less carbon atoms, in which $R^{2g}$ and $R^{3g}$ may be bonded to form a ring, and, in such case, $R^{2g}$ and $R^{3g}$ in combination represent a linear, branched or cyclic alkylene group with 2 to 15 carbon atoms; $R^{4g}$ to $R^{7g}$ each independently represents a hydrogen atom, an alkyl group or a cycloalkyl group; and $X_g$ represents $-CH_2-$, $-CH_2CH_2-$ or $-O-$, or mutually separated two $-H$ groups.

(ix)

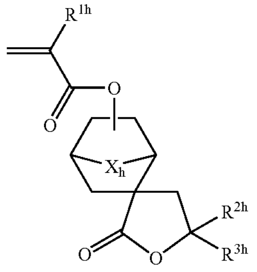

(x)

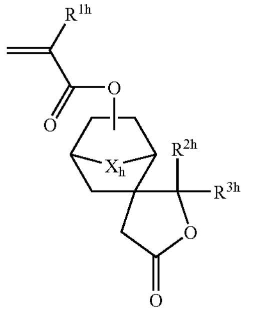

In formula (ix) or (x), $R^{1h}$ represents a hydrogen atom or a methyl group; $R^{2h}$ and $R^{3h}$ each independently represents a hydrogen atom or an alkyl or cycloalkyl group with 15 or less carbon atoms, in which $R^{2h}$ and $R^{3h}$ may be bonded to form a ring, and, in such case, $R^{2h}$ and $R^{3h}$ in combination represent a linear, branched or cyclic alkylene group with 2 to 15 carbon atoms; and $X_h$ represents —$CH_2$—, —$CH_2CH_2$— or —O—, or mutually separated two —H groups.

(xi)

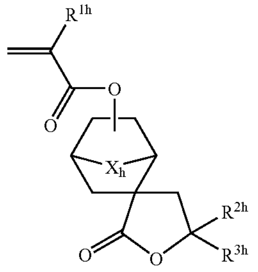

In formula (xi), $R^{1h}$ represents a hydrogen atom or a methyl group; $R^{2h}$ and $R^{3h}$ each independently represents a hydrogen atom or an alkyl or cycloalkyl group with 15 or less carbon atoms, in which $R^{2h}$ and $R^{3h}$ may be bonded to form a ring, and, in such case, $R^{2h}$ and $R^{3h}$ in combination represent a linear, branched or cyclic alkylene group with 2 to 15 carbon atoms; and $X_h$ represents —$CH_2$—, —$CH_2CH_2$— or —O—, or mutually separated two —H groups.

(xii)

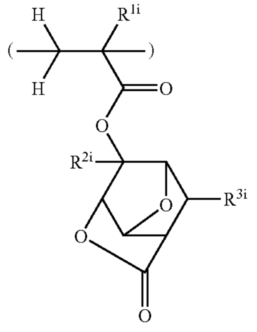

In formula (xii), $R^{1i}$ represents a hydrogen atom or a methyl group; $R^{2i}$ represents a hydrogen atom, or an alkyl or cycloalkyl group with 8 carbon atoms or less, specifically such as a methyl group, an ethyl group, a propyl group, an isopropyl group, an n-butyl group, a sec-butyl group, a tert-butyl group, a tert-amyl group, an n-pentyl group, an n-hexyl group, a cyclopentyl group, a cyclohexyl group, a cyclopentylmethyl group, a cyclopentylethyl group, a cyclohexylmethyl group or a cyclohexylethyl group; $R^{3i}$ represents $CO_2R^{4i}$ and $R^{4i}$ represents an alkyl or cycloalkyl group with 15 or less carbon atoms, such as a methyl group, an ethyl group, a propyl group, an isopropyl group, an n-butyl group, a sec-butyl group, a tert-butyl group, a tert-amyl group, an n-pentyl group, an n-hexyl group, a cyclopentyl group, a cyclohexyl group, an ethylcyclohexyl group, a butylcyclopentyl group, an ethylcyclohexyl group, a butylcyclohexyl group, an adamantyl group, an ethyladamantyl group, or a butyladamantyl group.

(xiii)

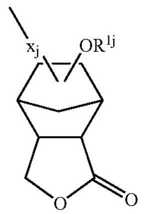

In formula (xiii), $R^{1j}$ represents a hydrocarbon group or an oxygen-containing hydrocarbon group; and $X_j$ is a group, formed for example by a (meth)acrylic repeating unit or a norbornene repeating unit, for connecting to a main chain.

The hydrocarbon group can be a linear hydrocarbon group, a branched hydrocarbon group, a hydrocarbon group having an alicyclic skeleton, or a hydrocarbon group having an aromatic skeleton. For example, it can be a linear alkyl group, a branched alkyl group or a cycloalkyl group with 1 to 12 carbon atoms. The oxygen-containing hydrocarbon group can be, for example, an alkylcarbonyl group or a hydroxyalkyl group with 1 to 12 carbon atoms. Examples of the linear alkyl group include a methyl group, an ethyl group and a propyl group; those of the branched alkyl group include an isopropyl group, an isobutyl group and a t-butyl group; those of the cycloalkyl group include a cyclohexyl group, a cyclopentyl group and a cycloheptyl group; those of the alkylcarbonyl group include a methylcarbonyl group, an ethylcarbonyl group and a propylcarbonyl group; and those of the hydroxyalkyl group include a hydroxymethyl group, a hydroxyethyl group and a hydroxypropyl group. Among these, specific examples of $R^{1j}$ suitable for the invention include a methyl group, an ethyl group, a methylcarbonyl group, an ethylcarbonyl group, a hydroxymethyl group and a hydroxyethyl group.

A substituting position of the substituent —$OR^{1j}$ can be any position other than the lactone ring. Preferably, in order not to deteriorate the dissolving property of the lactone ring in alkali, it is a position adjacent to a group $X_j$ connecting to the main chain.

$X_j$ is preferably an ether bond or an ester bond.

In the following, there are shown specific examples of the repeating unit having the lactone ring represented by the aforementioned formulae, but the invention is not limited to such examples.

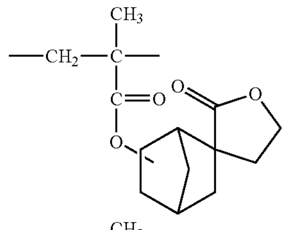

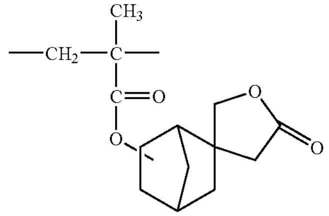

-continued

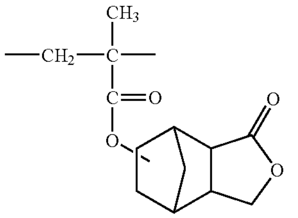

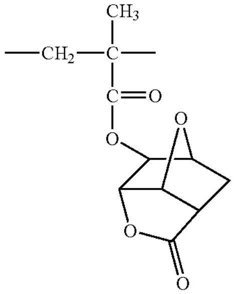

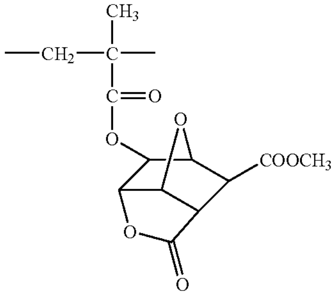

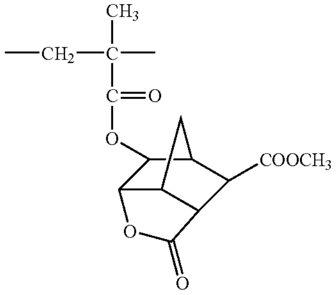

The resin (A) may further include a repeating unit formed by another acrylate ester.

The repeating unit formed by another acrylate ester, that may be contained in the resin (A), is preferably a repeating unit formed by an alkyl acrylate with 1 to 10 carbon atoms in the alkyl group, such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, or tetrahydrofurfuryl acrylate.

The resin (A) may further include a repeating unit formed by another methacrylate ester.

The repeating unit formed by another methacrylate ester, that may be contained in the resin (A), is preferably a repeating unit formed by an alkyl methacrylate with 1 to 10 carbon atoms in the alkyl group, such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, or tetrahydrofurfuryl methacrylate.

The aforementioned repeating structural unit may be employed singly or in a mixture of plural kinds. In particular, in the repeating unit (b) represented by the formula (2), repeating structural units of 2 or more kinds, represented by different ALG groups, are preferably contained for further improving an in-plane uniformity of a line width.

In the present invention, one kind of resin may be employed or in a combination of plural kinds.

The resin (A) can be synthesized according to an ordinary method (for example a radical polymerization). For example, it can be synthesized, as an ordinary synthesizing method, by charging monomer species in a reactor collectively or in the course of reaction, uniformly dissolving them, if necessary, in a reaction solvent capable dissolving monomers for example an ether such as tetrahydrofuran, 1,4-dioxane or diisopropyl ether, a ketone such as methyl ethyl ketone or methyl isobutyl ketone, an ester such as ethyl acetate, or a solvent used for dissolving the composition of the invention such as propylene glycol monomethyl ether acetate, to obtain a uniform solution and heating the solution if necessary in an inert gas atmosphere such as nitrogen or argon, and initiating a polymerization with a commercially available radical polymerization initiator (such as an azo initiator or a peroxide). Also a chain transfer agent (such as a mercaptane compound) is added, if necessary, simultaneously or separately. These components are added by mixing with the monomer or separately, into the reactor.

The initiator is added additionally or added in divided portions if necessary, and, after the termination of the reaction, the solution is charged into a solvent to recover a desired polymer by a method of powder or solid recovery. A concentration at the reaction is usually 10 weight % or higher, preferably 15 weight % or higher and further preferably 20 weight % or higher. A reaction temperature is normally 10 to 150° C., preferably 30 to 120° C., and further preferably 50 to 100° C. (In this specification, weight %, parts by weight and weight ratio are equal to mass %, parts by mass and mass ratio, respectively.)

In the resin (A);

the repeating unit (a) represented by formula (1) preferably has a content of 5 to 60 mol. % with respect to the total amount of all the repeating units, more preferably 10 to 50 mol. % and further preferably 15 to 50 mol. %;

the repeating unit (b) represented by formula (2) preferably has a content of 15 to 60 mol. % with respect to the total amount of all the repeating units, more preferably 20 to 55 mol. % and further preferably 25 to 50 mol. %;

the repeating unit (c) represented by formula (3) preferably has a content of 5 to 40 mol. % with respect to the total amount of all the repeating units, more preferably 10 to 35 mol. % and further preferably 15 to 30 mol. %;

the repeating unit (d) having another alicyclic lactone structure preferably has a content of 30 mol. % or less in all the repeating units, more preferably 25 mol. % or less and further preferably 20 mol. % or less;

the methacrylic acid repeating unit (e) preferably has a content of 1 to 25 mol. % in all the repeating units, more preferably 3 to 20 mol. % and further preferably 5 to 15 mol. %; and the repeating unit of another lactone structure preferably has a content of 30 mol. % or less in all the repeating units, more preferably 25 mol. % or less and further preferably 20 mol. % or less.

The resin of the invention has a weight-averaged molecular weight, measured by a GPC method as a value converted into polystyrene, preferably within a range of 1,000 to 200,000, more preferably 3,000 to 20,000. A weight-averaged molecular weight within the aforementioned range is preferable for rendering a heat resistance and a dry etching resistance compatible with a developing property and a film forming property.

A molecular weight distribution (Mw/Mn) is usually within a range of 1 to 5, preferably 1 to 4 and further preferably 1 to 3. A molecular weight distribution within such range is preferable for preventing a deterioration in a resolution, a resist profile, a roughing or roughness on a side wall of a resist pattern.

In the positive resist composition of the invention, all the resins of the invention has a proportion in the entire composition preferably of 40 to 99.99 weight % with respect to all the resist solid, and more preferably 50 to 99.97 weight %.

[2] Compound Generating an Acid by an Irradiation with an Actinic Ray or a Radiation (Component B)

The positive resist composition of the invention includes a compound capable of generating an acid by an irradiation with an actinic ray or a radiation. As such photoacid generator, there can be employed a photoinitiator of a photocationic polymerization, a photoinitiator of a photoradical polymerization, a photodecolorizer or a photo discoloring agent for a dye, a known compound capable of generating an acid by an irradiation with an actinic ray or a radiation employed in a microphotoresist or the like, or a mixture thereof.

Examples include a diazonium salt, a phosphonium salt, a sulfonium salt, an iodonium salt, an iminosulfonate, an oximesulfonate, a diazodisulfone a disulfone, an o-nitrobenzyl sulfonate.

There can also be employed a compound in which such group or a compound capable of generating an acid by an irradiation with an actinic ray or a radiation is introduced in a main chain or a side chain of a polymer, such as those described in U.S. Pat. No. 3,849,137, GP No. 3914407, JP-A Nos. 63-26653, 55-164824, 62-69263, 63-146038, 63-163452, 62-153853, and 63-146029.

Also there can be employed a compound capable of generating an acid by a light as described in U.S. Pat. No. 3,779,778 and EP No. 126,712.

Among such usable compounds capable of generating an acid under a decomposition by an irradiation with an actinic ray or a radiation, an preferred one is represented by following formulae (ZI), (ZII) and (ZIII).

ZI

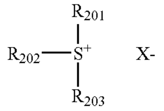

ZII

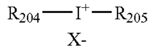

-continued

ZIII

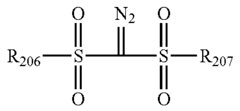

In the formula (ZI), $R_{201}$, $R_{202}$ and $R_{203}$ each independently represents an organic group.

$X^-$ represents a non-nucleophilic anion, which can be a sulfonic acid anion, a carboxylic acid anion, a bis(alkylsulfonyl)amide anion, a tris(alkylsulfonyl)methide anion, $BF_4^-$, $PF_6^-$ or $SbF_6^-$, preferably an organic anion group containing a carbon atom.

A preferred organic anion can be an organic anion represented by following formula:

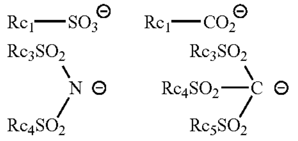

$R_{c1}$ represents an organic group.

An organic group as $R_{c1}$ can be a group with 1 to 30 carbon atoms, preferably an alkyl group, a cycloalkyl group, an aryl group or a plurality thereof bonded with a bonding group such as a single bond, —O—, —$CO_2$—, —S—, —$SO_3$—, or —$SO_2N(R_{d1})$—.

$R_{d1}$ represents a hydrogen atom or an alkyl group.

$R_{c3}$, $R_{c4}$ and $R_{c5}$ each independently represents an organic group.

An organic group represented by $R_{c3}$, $R_{c4}$ or $R_{c5}$ can preferably be same as the preferred organic group as Rc1, and most preferably a perfluoroalkyl group with 1 to 4 carbon atoms.

$R_{c3}$ and $R_{c4}$ may be bonded for form a ring.

A group formed by bonding of $R_{c3}$ and $R_{c4}$ can be an alkylene group or arylene group, preferably a perfluoroalkylene group with 2 to 4 carbon atoms.

An organic group represented by $R_{c1}$ or $R_{c3}$ to $R_{c5}$ is most preferably an alkyl group substituted in 1-position with a fluorine atom or a fluoroalkyl group, or a phenyl group substituted with a fluorine atom or a fluoroalkyl group. Presence of a fluorine atom or a fluoroalkyl group elevates an acidity of an acid generated by light irradiation, and improves a sensitivity.

An organic group as $R_{201}$, $R_{202}$ or $R_{203}$ generally contain 1 to 30 carbon atoms, preferably 1 to 20 carbon atoms.

Also two groups among $R_{201}$ to $R_{203}$ may be bonded to form a cyclic structure, which may include an oxygen atom, a sulfur atom, an ester bond, an amide bond, or a carbonyl group. A group formed by bonding of the two groups among $R_{201}$ to $R_{203}$ can be an alkylene group (such as a butylenes group or a pentylene group).

Specific examples of the organic group as $R_{201}$, $R_{202}$ or $R_{203}$ can be corresponding groups in the compounds (ZI-1), (ZI-2) and (ZI-3) to be explained later.

Also there may be employed a compound having a plurality of structures represented by the formula (ZI). For example there may be employed a compound represented by the formula (ZI), having such a structure in which at least one of $R_{201}$ to $R_{203}$ is bonded to at least one of $R_{201}$ to $R_{203}$ of another compound represented by the formula (ZI).

A further preferable (ZI) component can be a compound (ZI-1), (ZI-2) or (ZI-3) explained in the following.

A compound (ZI-1) is an arylsulfonium compound having an arylsulfonium cation, namely a compound of the formula (ZI) in which at least one of $R_{201}$ to $R_{203}$ is an aryl group.

In an arylsulfonium compound, all of $R_{201}$ to $R_{203}$ may be aryl groups, or a part of $R_{201}$ to $R_{203}$ is constituted of an aryl group and a remainder may be constituted of an alkyl group or a cycloalkyl group.

An arylsulfonium compound can be, for example, a triarylsulfonium compound, a diarylalkylsulfonium compound, an aryldialkylsulfonium compound, a diarylcycloalkylsulfonium compound, or an aryldicycloalkylsulfonium compound.

An aryl group in the arylsulfonium compound is preferably an aryl group such as a phenyl group or a naphthyl group, or a heteroaryl group such as an indole residue, or a pyrrole residue, and more preferably a phenyl group or an indole residue. In case the arylsulfonium compound has two or more aryl groups, such two or more aryl groups may be same or different.

An alkyl group present, if necessary, in the arylsulfonium compound is preferably a linear or branched alkyl group with 1 to 15 carbon atoms, such as a methyl group, an ethyl group, a propyl group, an n-butyl group, a sec-butyl group or a t-butyl group.

A cycloalkyl group present, if necessary, in the arylsulfonium compound is preferably a linear or branched cycloalkyl group with 3 to 15 carbon atoms, such as a cyclopropyl group, a cyclobutyl group, or a cyclohexyl group.

The aryl group, the aryl group or the cycloalkyl group as $R_{201}$ to $R_{203}$ may have, as a substituent, an alkyl group (for example with 1 to 15 carbon atoms), a cycloalkyl group (for example with 3 to 15 carbon atoms), an aryl group (for example with 6 to 14 carbon atoms), an alkoxy group (for example with 1 to 15 carbon atoms), a halogen atom, a hydroxyl group, or a phenylthio group. A preferred substituent is a linear or branched alkyl group with 1 to 12 carbon atoms, a cycloalkyl group with 3 to 12 carbon atoms, or a linear, branched or cyclic alkoxy group with 1 to 12 carbon atoms, and most preferably an alkyl group with 1 to 4 carbon atoms, or an alkoxy group with 1 to 4 carbon atoms. The substituent may be substituted on any one of $R_{201}$ to $R_{203}$ or all of $R_{201}$ to $R_{203}$. Also in case any of $R_{201}$ to $R_{203}$ is an aryl group, the substituent is preferably substituted in p-position of the aryl group.

Then a compound (ZI-2) will be explained.

The compound (ZI-2) corresponds to a case where $R_{201}$ to $R_{203}$ in formula (ZI) each independently represents an organic group not containing an aromatic ring. The aromatic ring includes an aromatic ring containing a hetero atom.

An organic group not containing an aromatic ring in $R_{201}$ to $R_{203}$ generally has 1 to 30 carbon atoms, and preferably 1 to 20 carbon atoms.

$R_{201}$ to $R_{203}$ each independently represents preferably an alkyl group, a cycloalkyl group, an allyl group or a vinyl group, more preferably a linear, branched or cyclic 2-oxoalkyl group, an alkoxycarbonylmethyl group, and particularly preferably a linear- or branched 2-oxoalkyl group.

An alkyl group as $R_{201}$ to $R_{203}$ may be linear or branched, and can preferably a linear or branched alkyl group with 1 to 10 carbon atoms (such as a methyl group, an ethyl group, a propyl group, a butyl group or a pentyl group), and more preferably a linear or branched 2-oxoalkyl group or an alkoxycarbonylmethyl group.

A cycloalkyl group as $R_{201}$ to $R_{203}$ can preferably be a cycloalkyl group with 3 to 10 carbon atoms (such as a cyclopentyl group, a cyclohexyl group or a norbornyl group), and more preferably a cyclic 2-oxoalkyl group.

The linear, branched or cyclic 2-oxoalkyl group as $R_{201}$ to $R_{203}$ is preferably a group having a >C=O structure in a 2-position of the aforementioned alkyl or cycloalkyl group.

An alkoxy group in the alkoxycarbonylmethyl group as $R_{201}$ to $R_{203}$ can preferably be an alkoxy group with 1 to 5 carbon atoms (such as a methoxy group, an ethoxy group, a propoxy group, a butoxy group or a pentoxy group).

$R_{201}$ to $R_{203}$ may be further substituted with a halogen atom, an alkoxy group (for example with 1 to 5 carbon atoms), a hydroxyl group, a cyano group or a nitro group.

A compound (ZI-3) is a compound having a phenacylsulfonium structure represented by following formula (ZI-3).

(ZI-3)

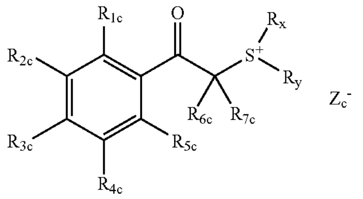

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Two members or more of $R_{1c}$ to $R_{5c}$, $R_{6c}$ and $R_{7c}$, or $R_x$ and $R_y$ may be bonded to form a ring.

$Z_c^-$ represents a non-nucleophilic anion, and can be similar to the non-nucleophilic anion $X^-$ in the formula (ZI).

An alkyl group as $R_{1c}$ to $R_{7c}$ may be linear or branched, and can be a linear or branched alkyl group with 1 to 20 carbon atoms, and preferably with 1 to 12 carbon atoms (such as a methyl group, an ethyl group, a linear or branched propyl group, a linear or branched butyl group, or a linear or branched pentyl group).

A cycloalkyl group as $R_{1c}$ to $R_{7c}$ can preferably be a cycloalkyl group with 3 to 8 carbon atoms (such as a cyclopentyl group or a cyclohexyl group).

An alkoxy group as $R_{1c}$ to $R_{5c}$ may be linear, branched or cyclic, and can for example be an alkoxy group with 1 to 10 carbon atoms, and preferably a linear or branched alkoxy group with 1 to 5 carbon atoms (such as a methoxy group, an ethoxy group, a linear or branched propoxy group, a linear or branched butoxy group, or a linear or branched pentoxy group), or a cyclic alkoxy group with 3 to 8 carbon atoms (such as a cyclopentyloxy group or a cyclohexyloxy group).

A group formed by bonding of two members or more of $R_{1c}$ to $R_{5c}$, $R_{6c}$ and $R_{7c}$, or $R_x$ and $R_y$ can be a butylene group or pentylene group. This ring structure may contain an oxygen atom, a sulfur atom, an ester bond or an amide bond.

It is preferable that any one of $R_{1c}$ to $R_{5c}$ is a linear or branched alkyl group, a cycloalkyl group or a linear, branched or cyclic alkoxy group, and more preferable that a summed number of carbon atoms in $R_{1c}$ to $R_{5c}$ is 2 to 15. In this manner it is rendered possible to improve a solubility in solvents, and to suppress particle generation in the storage.

An alkyl group and a cycloalkyl group as $R_x$ or $R_y$ can be similar to the alkyl group and the cycloalkyl group as $R_{1c}$ to $R_{7c}$.

$R_x$ and $R_y$ each is preferably a 2-oxoalkyl group or an alkoxycarbonylmethyl group.

The 2-oxoalkyl group can be a group having a >C=O structure in a 2-position of the alkyl or cycloalkyl group as $R_{1c}$ to $R_{5c}$.

An alkoxy group in the alkoxycarbonylmethyl group can be similar to the alkoxy group as $R_{1c}$ to $R_{5c}$.

$R_x$ and $R_y$ each is preferably an alkyl or cycloalkyl group with 4 or more carbon atoms, more preferably 6 or more carbon atoms and further preferably 8 or more carbon atoms.

In formulae (ZII) and (ZIII), $R_{204}$ to $R_{207}$ each independently represents an aryl group, an alkyl group or a cycloalkyl group. $X^-$ represents a non-nucleophilic anion, and can be similar to the non-nucleophilic anion $X^-$ in the formula (I).

An aryl group as $R_{204}$ to $R_{207}$ is preferably a phenyl group or a naphthyl group, and further preferably a phenyl group.

An alkyl group as $R_{204}$ to $R_{207}$ may be linear or branched, and can preferably be a linear or branched alkyl group with 1 to 10 carbon atoms (such as a methyl group, an ethyl group, a propyl group, a butyl group or a pentyl group).

A cycloalkyl group as $R_{204}$ to $R_{207}$ can preferably be a cycloalkyl group with 3 to 10 carbon atoms (such as a cyclopentyl group, a cyclohexyl group or a norbornyl group).

A substituent that may be present on $R_{204}$ to $R_{207}$ can for example be an alkyl group (for example with 1 to 15 carbon atoms), a cycloalkyl group (for example with 3 to 15 carbon atoms), an aryl group (for example with 6 to 15 carbon atoms), an alkoxy group (for example with 1 to 15 carbon atoms), a halogen atom, a hydroxyl group or a phenylthio group.

A usable compound that generates an acid by an irradiation with an actinic ray or a radiation also includes compounds represented by the following formulae (ZIV), (ZV) and (ZVI).

$$Ar_3-SO_2-SO_2-Ar_4$$ ZIV

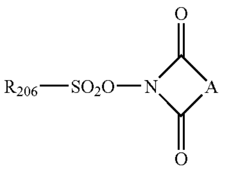

ZV

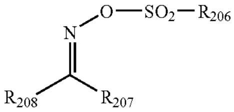

ZVI

In formulae (ZIV) to (ZVI), $Ar_3$ and $Ar_4$ each independently represents an aryl group.

$R_{206}$, $R_{207}$ and $R_{208}$ each independently represents an alkyl group, a cycloalkyl group or an aryl group.

A represents an alkylene group, an alkenylene group or an arylene group.

Within the compounds generating an acid by an irradiation with an actinic ray or a radiation, those represented by (ZI) to (ZIII) are more preferable.

Particularly preferred examples, within the compounds generating an acid by an irradiation with an actinic ray or a radiation, will be shown in the following.

(z1)

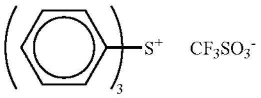

(z2)

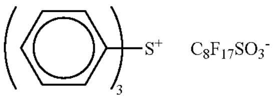

(z3)

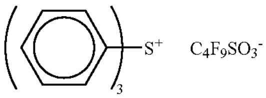

(z4)

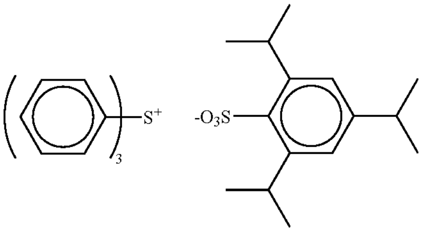

(z5)

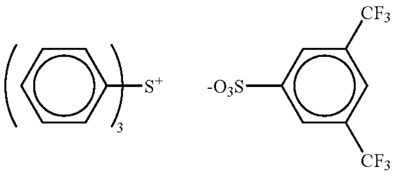

(z6)

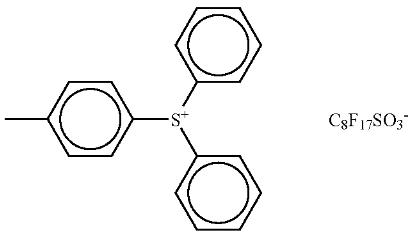

-continued
(z7)
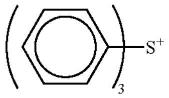
$C_{11}F_{23}COO^-$
(z8)
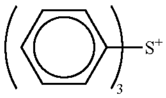
$C_2F_5$—O—$C_2F_5SO_3^-$
(z9)
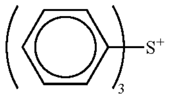
$CH_3COO^-$
(z10)
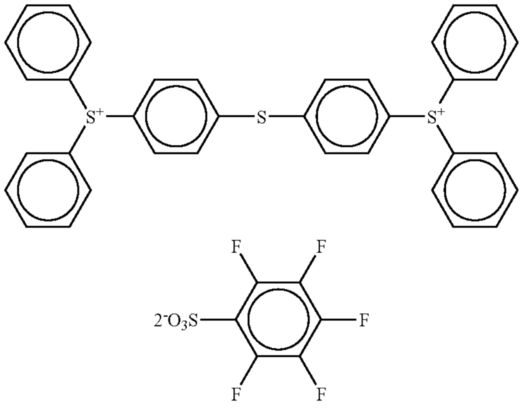
(z11)
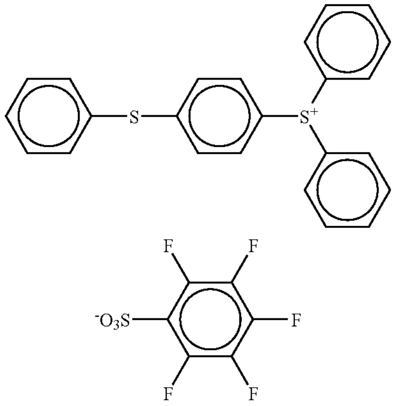
(z12)
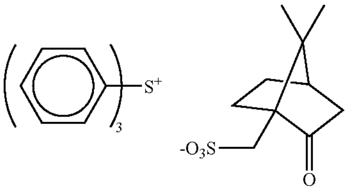
(z13)
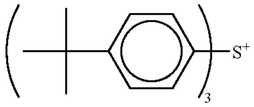
$C_4F_9SO_3^-$
(z14)
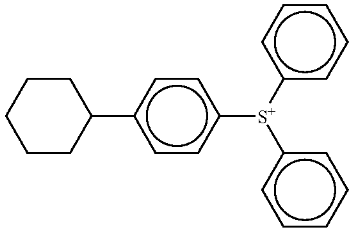
$C_4F_9SO_3^-$
(z15)
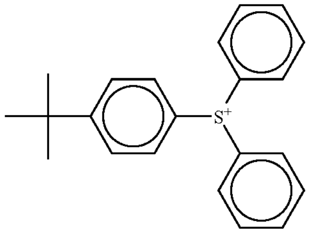
$C_4F_9SO_3^-$
(z16)
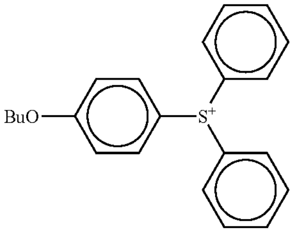
$C_4F_9SO_3^-$ -continued
(Z17)
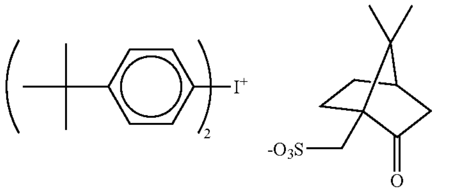
(z18)
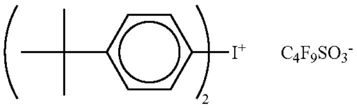
(z19)
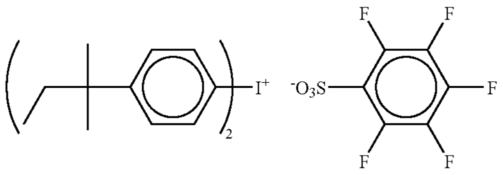
(z20)
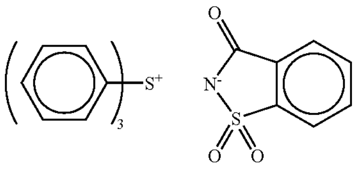
(z21)
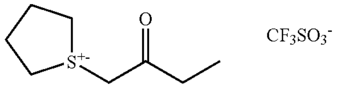
(z22)
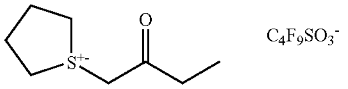
(z23)
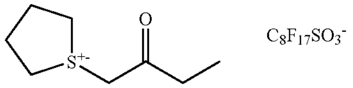
(z24)
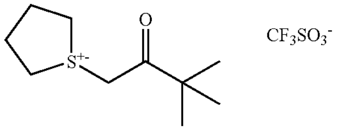
(z25)
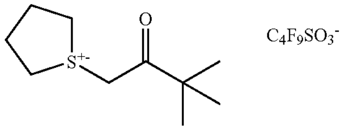
(z26)
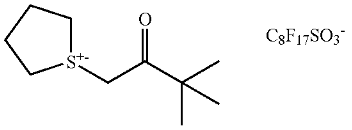
(z27)
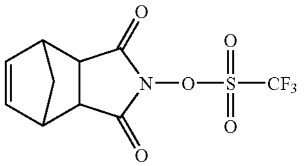
(z28)
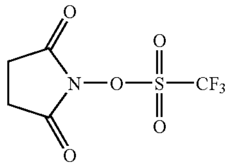
(z29)
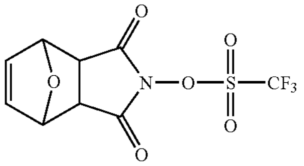
(z30)
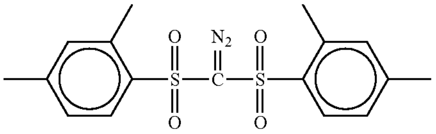
(z31)
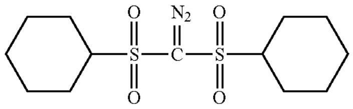
(z32)
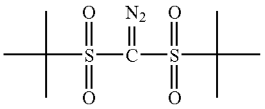
(z33)
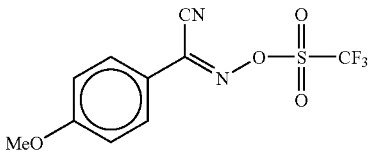

-continued
(z34)
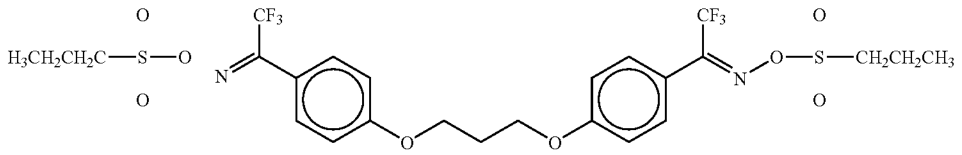
(z35)
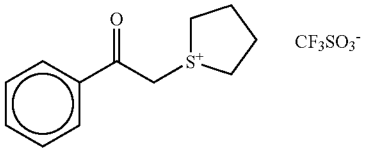
(z36)
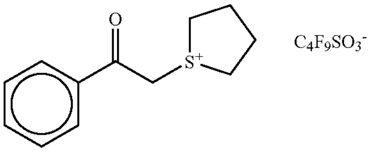
(z37)
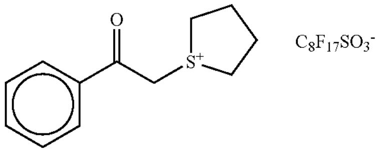
(z38)
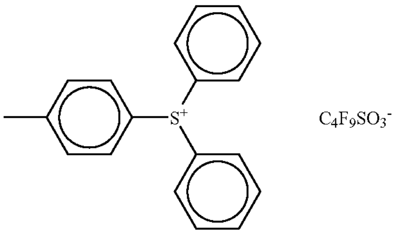
(z39)
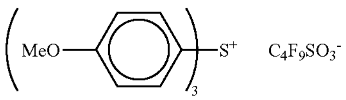
(z40)
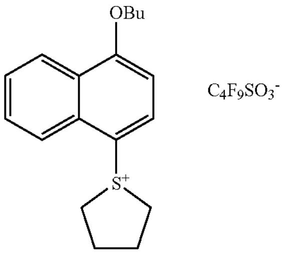
(z41)
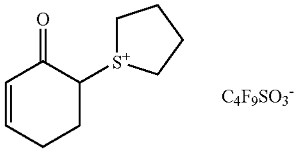
(z42)
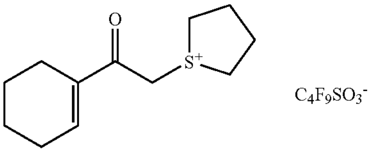
(z43)
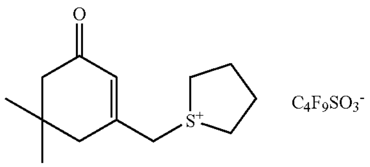
(z44)
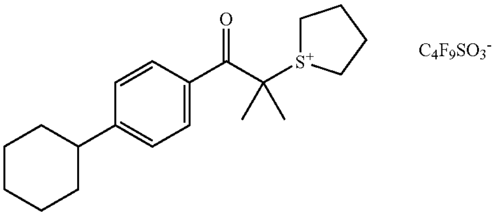
(z45)
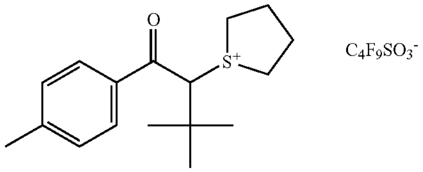
(z46)
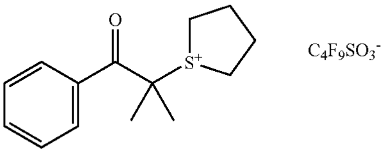

-continued
(z47)
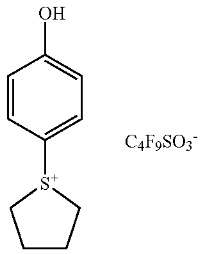
(z48)
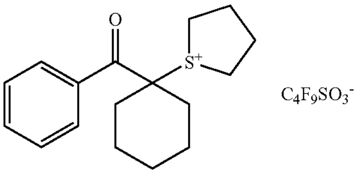
(z49)
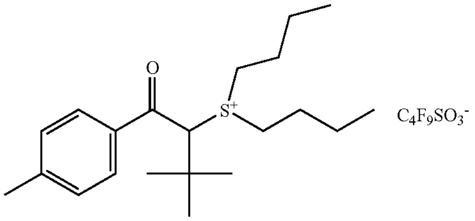
(z50)
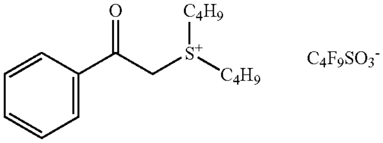
(z51)
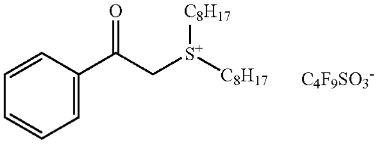
(z52)
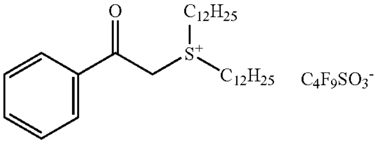
(z53)
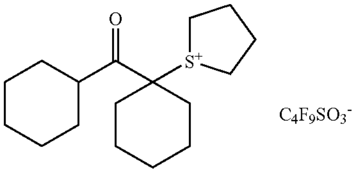
(z54)
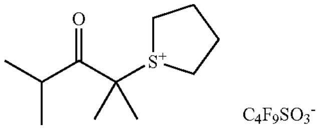
(z55)
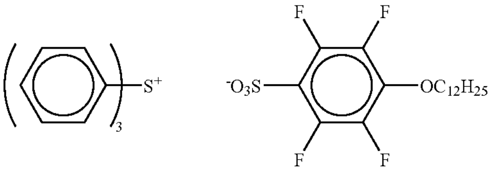
(z56)
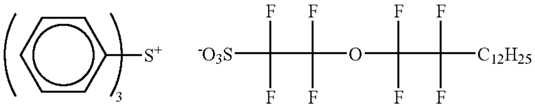
(z57)
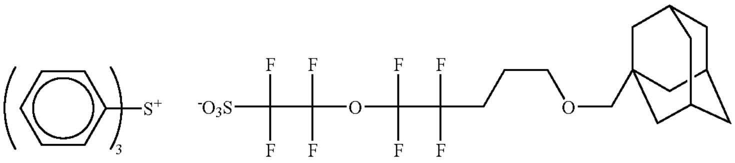
(z58)
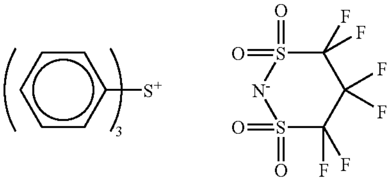
(z59)
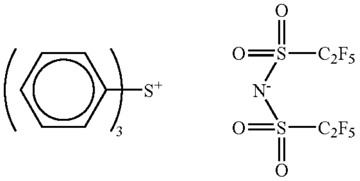

-continued (z60)

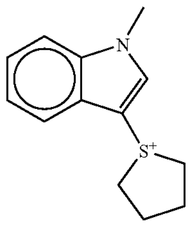

$C_4F_9SO_3^-$ (z61)

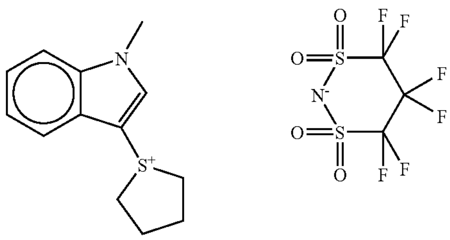

The compounds generating an acid by an irradiation with an actinic ray or a radiation may be employed singly or in a combination of two or more kinds.

The compounds generating an acid by an irradiation with an actinic ray or a radiation preferably has a content, in the positive resist composition, of 0.1 to 20 weight % with respect to the total solid of the resist composition, more preferably 0.5 to 10 weight % and further preferably 1 to 7 weight %.

[3] Nitrogen-Containing Basic Compound

The positive resist composition of the invention preferably contains a nitrogen-containing basic compound. The nitrogen-containing basic compound can be an organic amine, a basic ammonium salt or a basic sulfonium salt, which does not cause a sublimation or does not deteriorate the performances of the resist.

Among such nitrogen-containing basic compounds, an organic amine is preferred in an excellent imaging property.

For example, there can be employed compounds described in JP-A Nos. 63-149640, 5-249662, 5-127369, 5-289322, 5-249683, 5-289340, 5-232706, 5-237282, 6-242605, 6-242606, 6-266100, 6-266110, 6-317902, 7-120929, 7-146558, 7-319163, 7-508840, 7-333844, 7-219217, 7-92678, 7-28247, 8-22120, 8-110638, 8-123030, 9-274312, 9-166871, 9-292708, 9-325496, JP-T No. 7-508840, U.S. Pat. Nos. 5,525,453, 5,629,134, and 5,667,938.

The nitrogen-containing basic compound can preferably be 1,5-diazabicyclo[4,3,0]-5-nonene, 1,8-diazabicyclo[5,4,0]-7-undecene, 1,4-diazabicyclo[2,2,2]-octane, 4-dimethylaminopyridine, 1-naphthylamine, piperidine, hexamethylenetetramine, an imidazole, a hydroxypyridine, a pyridine, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine or tributyl amine.

Among these, there is preferred an organic amine such as 1,5-diazabicyclo[4,3,0]-5-nonene, 1,8-diazabicyclo[5,4,0]-7-undecene, 1,4-diazabicyclo[2,2,2]-octane, 4-dimethylaminopyridine, 1-naphthylamine, piperidine, hexamethylenetetramine, an imidazole, a hydroxypyridine, a pyridine, 4,4'-diaminodiphenyl ether, triethylamine or tributylamine.

The nitrogen-containing basic compound generally has a content of 0.001 to 10 parts by weight with respect to 100 parts by weight (solid) of the positive resist composition, preferably 0.001 to 5 parts by weight and more preferably 0.001 to 0.5 parts by weight.

[4] Fluorinated and/or Silicone Surfactant

The positive resist composition of the invention preferably further contains one or more of a fluorinated and/or silicone surfactant (a fluorinated surfactant, a silicone surfactant or a surfactant containing a fluorine atom and a silicon atom).

The positive resist composition of the invention, by including such surfactant, can provide a resist pattern with little defects in adhesion and development with a satisfactory sensitivity and a satisfactory resolution, in case of employing an exposure source of a wavelength of 250 nm or less, particularly 220 nm or less.

Such surfactant can be those described in JP-A Nos. 62-36663, 61-226746, 61-226745, 62-170950, 63-34540, 7-230165, 8-62834, 9-54432, 9-5988, and 2002-277862, U.S. Pat. Nos. 5,405,720, 5,360,692, 5,529,881, 5,296,330, 5,436,098, 5,576,143, 5,294,511 and 5,824,451, and following commercially available surfactants can also be utilized.

The usable commercially available surfactants include fluorinated surfactants and silicone surfactants such as Eftop EF301 and EF303 (manufactured by Shin-Akita Kasei Co.), Florad FC 430 and 431 (manufactured by Sumitomo 3M Co.), Megafac F171, F173, F176, F189, R08 (manufactured by Dai-Nippon Inks and Chemicals Inc.), Surflon S382, SC101, 102, 103, 104, 105, 106 (manufactured by Asahi Glass Co.) and Troysol S-366 (manufactured by Troy Chemical Co.). Also a polysiloxane polymer KP-341 (manufactured by Shin-etsu Chemical Co.) can be used as a silicone surfactant.

In addition to these known ones, there can also be employed a surfactant utilizing a polymer having a fluoro aliphatic group, which is derived from a fluoro aliphatic compound manufactured by a telomerization method (also called telomer method) or by an oligomerization method (also called oligomer method). The fluoro aliphatic compound can be synthesized by a method described in JP-A No. 2002-90991.

The polymer having a fluoro aliphatic group is preferably a copolymer of a monomer having a fluoro aliphatic group and (poly(oxyalkylene)) acrylate and/or (poly(oxyalkylene)) methacrylate, either having an irregular distribution or being block copolymerized. Also the poly(oxyalkylene) group can be a poly(oxyethylene) group, a poly(oxypropylene) group or a poly(oxbutylene) group, and there can also be employed a unit having alkylenes of different chain lengths within a same unit such as a poly(oxyethylene-oxypropylene-oxyethylene block-connected) group or a poly(oxyethylene-oxypropylene block-connected) group. Also the copolymer of a monomer having a fluoro aliphatic group and (poly(oxyalkylene)) acrylate (or methacrylate) is not limited to a binary copolymer but can also be a ternary or higher copolymer in which monomers having two or more different fluoro aliphatic groups and two or more different (poly(oxyalkylene)) acrylates (or methacrylates) are simultaneously copolymerized.

Examples of the commercially available surfactant include Megafac F178, F470, F473, F475, F476 and F472 (manufactured by Dai-Nippon Inks and Chemicals Inc.).

There can also be employed a copolymer of an acrylate (or methacrylate) having a $C_6F_{13}$ group and (poly(oxyalkylene)) acrylate (or methacrylate), a copolymer of an acrylate (or methacrylate) having a $C_6F_{13}$ group, (poly(oxyethylene)) acrylate (or methacrylate), and (poly(oxypropylene)) acrylate (or methacrylate), a copolymer of an acrylate (or methacrylate) having a $C_8F_{17}$ group and (poly(oxyalkylene)) acrylate (or methacrylate), a copolymer of an acrylate (or methacrylate) having a $C_8F_{17}$ group, (poly(oxyethylene)) acrylate (or methacrylate), and (poly(oxypropylene)) acrylate (or methacrylate).

An amount of the surfactant is preferably 0.0001 to 2 weight % with respect to the entire positive resist composition (excluding solvents), more preferably 0.001 to 1 weight %.

[5] Solvent

In the present invention, a positive resist composition is prepared by dissolving various components in a solvent. In the invention, a solvent means a compound that is liquid under conditions of 25° C. and 760 mmHg, and that has a boiling point of 250° C. or lower.

The positive resist composition of the invention can employ, as a solvent, a single solvent or a mixed solvent. The single solvent preferably contains an alkyl lactate or a propylene glycol monoalkyl ether carboxylate. The mixed solvent preferably contains at least two solvents selected from propylene glycol monoalkyl ether carboxylate, propylene glycol monoalkyl ether, cyclohexanone and alkyl lactate, and there is more preferred a mixed solvent constituted of at least a solvent selected from a group of propylene glycol monoalkyl ether carboxylate and alkyl lactate (also called solvent of group A), and at least a solvent selected from a group of propylene glycol monoalkyl ether and cyclohexanone (also called solvent of group B), or a mixed solvent constituted of propylene glycol monoalkyl ether carboxylate and alkyl lactate.

As propylene glycol monoalkyl ether carboxylate, there is preferred propylene glycol monomethyl ether acetate, propylene glycol monomethyl ether propionate, propylene glycol monoethyl ether acetate, or propylene glycol monoethyl ether propionate.

As propylene glycol monoalkyl ether, propylene glycol monomethyl ether, or propylene glycol monoethyl ether is preferred.

As alkyl lactate, methyl lactate, or ethyl lactate is preferred.

The solvent of group A and the solvent of group B are used in a weight ratio (A:B) preferably from 90:10 to 15:85, more preferably from 85:15 to 20:80, and further preferably from 80:20 to 25:75.

The propylene glycol monoalkyl ether carboxylate and alkyl lactate are used in a weight ratio (propylene glycol monoalkyl ether carboxylate:alkyl lactate) is preferably from 90:10 to 10:90, more preferably 85:15 to 15:85 and further preferably from 80:20 to 20:80.

In the invention, solids of the composition including the aforementioned components are dissolved in the mixed solvent preferably with a solid concentration of 3 to 25 weight %, more preferably 5 to 22 weight % and further preferably 7 to 20 weight %.

In the invention, preferred examples of a combination of the mixed solvent include:

propylene glycol monomethyl ether acetate+propylene glycol monomethyl ether;

propylene glycol monomethyl ether acetate+propylene glycol monoethyl ether;

propylene glycol monomethyl ether acetate+cyclohexanone;

propylene glycol monomethyl ether acetate+ethyl lactate;

propylene glycol monomethyl ether acetate+methyl lactate;

propylene glycol monomethyl ether propionate+propylene glycol monomethyl ether;

propylene glycol monomethyl ether propionate+propylene glycol monoethyl ether;

propylene glycol monomethyl ether propionate+cyclohexanone;

propylene glycol monomethyl ether propionate+ethyl lactate;

propylene glycol monomethyl ether propionate+methyl lactate;

propylene glycol monoethyl ether acetate+propylene glycol monomethyl ether;

propylene glycol monoethyl ether acetate+propylene glycol monoethyl ether;

propylene glycol monoethyl ether acetate+cyclohexanone;

propylene glycol monoethyl ether acetate+ethyl lactate;

propylene glycol monoethyl ether acetate+methyl lactate;

propylene glycol monoethyl ether propionate+propylene glycol monomethyl ether;

propylene glycol monoethyl ether propionate+propylene glycol monoethyl ether;

propylene glycol monoethyl ether propionate+cyclohexanone, propylene glycol monoethyl ether propionate+ethyl lactate;

propylene glycol monoethyl ether propionate+methyl lactate;

ethyl lactate+propylene glycol monomethyl ether;

ethyl lactate+propylene glycol monoethyl ether;

methyl lactate+propylene glycol monomethyl ether;

methyl lactate+propylene glycol monoethyl ether;

ethyl lactate+cyclohexanone; and methyl lactate+cyclohexanone.

Particularly preferred combinations of the solvents include:

propylene glycol monomethyl ether acetate+propylene glycol monomethyl ether;

propylene glycol monomethyl ether acetate+cyclohexanone;

propylene glycol monomethyl ether acetate+ethyl lactate; and ethyl lactate+propylene glycol monomethyl ether.

Another solvent may be added to each of the aforementioned mixed solvents. An amount of such another solvent is generally 30 parts by weight or less with respect to 100 parts by weight of the mixed solvent of the invention. Such another solvent can be for example ethylene dichloride, cyclopentanone, methyl ethyl ketone, γ-butyrolactone, ethylene carbonate, propylene carbonate, toluene, N,N-dimethylformamide, dimethyl sulfoxide, N-methylpyrrolidone or tetrahydrofuran.

<Other Components>

The positive resist composition of the invention may contain, if necessary, a low molecular acid-decomposable compound having a molecular weight of 2,000 or less, having a group decomposable by an action of an acid and showing an increase in an alkali solubility by an action of an acid.

As such low molecular acid-decomposable compound, there can be employed an alicyclic compound having an acid-decomposable group such as a cholic acid derivative, a dehydrocholic acid derivative, a deoxycholic acid derivative, a lithocholic acid derivative, an ursocholic acid derivative or an abietic acid derivative, or an aromatic compound having an acid-decomposable group such as a naphthalene derivative, as described in Proc. SPIE, 2724, 355(1996), JP-A No. 8-15865, U.S. Pat. Nos. 5,310,619 and 5,372,912, and J. Photopolym. Sci., Tech., Vol. 10, No. 3,511(1997).

Also a low-molecular acid-decomposable dissolution inhibitor described in JP-A No. 6-51519 can be utilized within an extent not deteriorating the transmittance at 220 nm, and a 1,2-naphthoquinone diazide compound can also be utilized.

In case of employing such low-molecular acid-decomposable dissolution inhibitor in the positive resist composition of the invention, it is usually employed with a content of 0.5 to 50 parts by weight with respect to 100 parts by weight (solid) of the resist composition, preferably 0.5 to 40 parts by weight, further preferably 0.5 to 30 parts by weight and particularly preferably 0.5 to 20.0 parts by weight.

An addition of such low-molecular acid-decomposable dissolution inhibitor improves not only the aforementioned defects in development but also a dry etching resistance.

The positive resist composition of the invention may further include, if necessary, a dissolution promoter to the developer, an antihalation agent, a plasticizer, a surfactant, a photosensitizer, an adhesion promoter, a crosslinking agent, a photobase generator and the like.

A dissolution promoter to the developer, employable in the invention, can be, as described in JP-A No. 3-206458, a low-molecular compound with a molecular weight of 1000 or less, such as a compound having two or more phenolic hydroxyl groups, a naphthol such as 1-naphthol, a compound having a carboxyl group, a carboxylic acid anhydride, a sulfonamide compound or a sulfonylimide compound.

Such dissolution promoter is preferably employed in an amount of 30 weight % or less with respect to all the weight (solids) of the composition, more preferably 20 weight % or less.

A preferred antihalation agent is a compound capable of efficiently absorbing the irradiating radiation, for example a substituted benzene such as fluorene, 9-fluorenone or benzophenone; or a polycyclic aromatic compound such as anthracene, anthracene-9-methanol, anthracene-9-carboxyethyl, phenanthrene, perylene, or azilene. Among these, a polycyclic aromatic compound is particularly preferable. Such antihalation agent reduces a reflected light from the substrate and an influence of multiple reflections within the resist film, thereby reducing the standing waves.

Also a photosensitizer can be added for improving an acid generating rate by an exposure. Examples of the preferred photosensitizer include benzophenone, p,p'-tetramethyldiaminobenzophenone, 2-chlorothioxanthone, anthrone, 9-ethoxyanthracene, pyrene, phenothiazine, benzyl, benzoflavin, acetophenone, phenanthrene, benzoquinone, anthraquinone and 1,2-naphthoquinone, but such examples are not restrictive. These photosensitizers can also be used as the antihalation agent.

<Method of Use>

The positive resist composition of the invention is used by coating on a substrate, by a suitable coating method with a spinner or a coater, and is heated to form a resist film. The coated film preferably has a thickness of 0.2 to 1.2 μm.

A usable substrate include an ordinary bare Si substrate, an SdG substrate or a substrate having an inorganic antireflection film to be explained in the following.

Also a commercially available inorganic or organic antireflection film can be utilized if necessary.

As the antireflection film there can be employed an inorganic film such as of titanium, titanium dioxide, titanium nitride, chromium oxide, carbon or a-silicon, or an organic film formed by a light absorbing agent and a polymer material. The former requires a vacuum evaporation apparatus, a CVD apparatus or a sputtering apparatus for film formation. The organic antireflection film can be, for example, constituted of a material formed by a condensate of a diphenylamine derivative and a formaldehyde-denatured melamine resin, an alkali-soluble resin and a light absorbing agent as described in JP-B No. 7-69611, a material formed by a reaction product of a maleic anhydride copolymer and a diamine light absorbing agent described in U.S. Pat. No. 5,294,680, a material containing a resinous binder and a methylolmelamine thermal crosslinking agent described in JP-A No. 6-118631, an antireflection film of an acrylic resin having a carboxylic acid group, an epoxy group and a light absorbing group within a same molecule as described in JP-A No. 6-118656, a material formed by methylolmelamine and a benzophenone light absorbing agent as described in JP-A No. 8-87115, or a material formed by adding a low-molecular light absorbing agent to a polyvinyl alcohol resin, as described in JP-A No. 8-179509.

Also as an organic antireflection film, there can be employed DUV-30 series, DUV-40 series or ARC 25 of Brewer Science Inc. or AC-2, AC-3, AR19 or AR20 of Shipley Co.

A resist film, after formation on the substrate, is exposed through a predetermined mask, heated and developed. In this manner, a satisfactory resist pattern can be obtained. An exposing light is a far ultraviolet light, preferably of 250 nm or less, more preferably 220 nm or less. It can more specifically be an actinic ray of an KrF excimer laser (248 nm), an ArF excimer laser (193 nm) or an $F_2$ excimer laser (157 nm), or a radiation such as an X-ray or an electron beam.

As an alkaline developer for the positive resist composition, there can be employed an alkaline aqueous solution of an inorganic alkali such as sodium hydroxide, potassium hydroxide, sodium carbonate, sodium silicate, sodium metasilicate, or ammonia solution; a primary amine such as ethylamine or n-propylamine; a secondary amine such as diethylamine or di-n-butylamine; a tertiary amine such as triethylamine or methyldiethylamine; an alcohol amine such as dimethylethanol amine, or triethanolamine; a quaternary ammonium salt such as tetramethylammonium hydroxide or tetraethylammonium hydroxide; or a cyclic amine such as pyrrole or piperidine.

Also an alcohol or a surfactant may be added in a suitable amount to the alkaline aqueous solution.

The alkaline developer generally has an alkali concentration of 0.1 to 20 weight %, and a pH value of 10.0 to 15.0.

EXAMPLES

In the following, the present invention will be clarified further by examples, but the present invention is not limited to such examples.

Synthesis Example 1 (Synthesis of Resin (1))

9-methacryloyloxy-5-methyl-2-oxatricyclo[4.2.1.0$^{4,8}$]nonan-3-one, 2-methyl-2-adamantyl methacrylate, and methacrylic acid were charged in a proportion of 44/50/6

(molar ratio), dissolved in propylene glycol monomethyl ether acetate (PGMEA)/propylene glycol monomethyl ether (PGME)=60/40 (weight ratio), to obtain 450 g of a solution of a solid concentration of 22 weight %. The solution was added with a polymerization initiator V-601 (dimethyl-2,2'-azobis(2-methylpropionate)), manufactured by Wako Pure Chemicals Industries Inc., by 8 mol and was dropwise added, over 6 hours and in a nitrogen atmosphere, to 50 g of a mixed solution of PGMEA/PGME=60/40 (weight ratio), heated to 80° C. After the addition, the reaction liquid was agitated for 2 hours. After the reaction, the reaction liquid was cooled to the room temperature and poured into 5 L of a mixed solvent of hexane/ethyl acetate=9/1 (weight ratio), and precipitated white powder was separated by filtering to obtain the desired resin (1).

It had a polymer composition (molar ratio) of 48/42/10 determined by $^{13}$CNNM and titration. Also it had a weight-averaged molecular weight of 8900 determined by a GPC measurement in a conversion to polystyrene, and a dispersion of 1.77.

Following resins (2) to (13) were synthesized in a similar manner. A polymerization initiator, a chain transfer agent and a polymerization catalyst employed, and a molecular weight and a dispersion of the obtained resin are shown in Table 1.

(1)

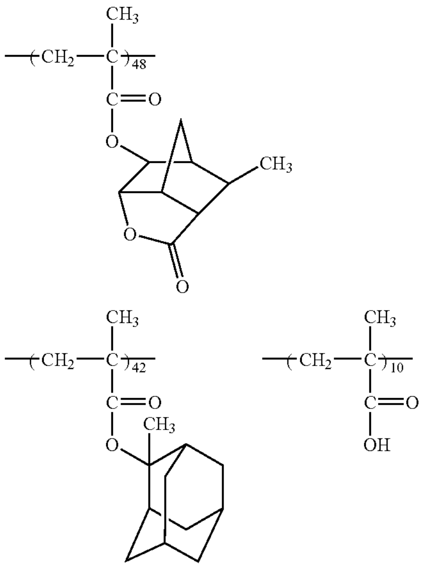

(2)

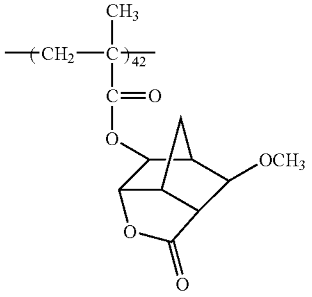

-continued

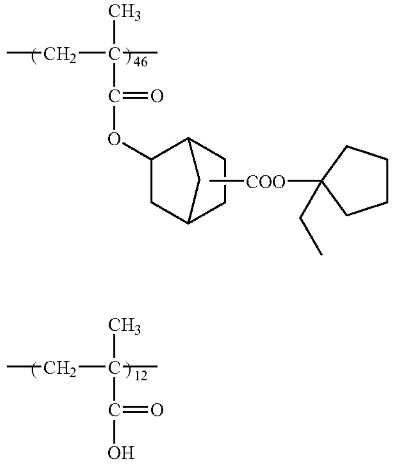

(3)

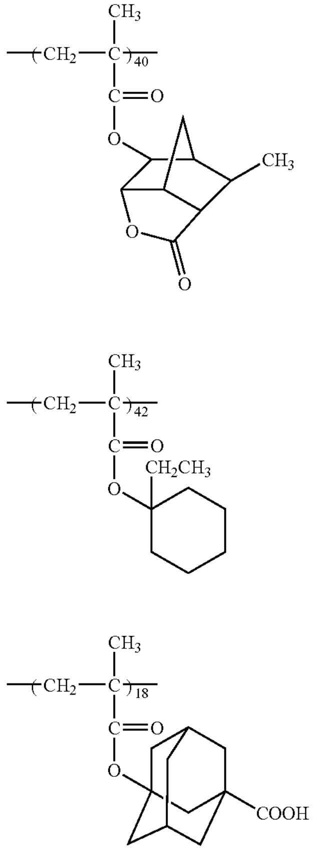

(4)

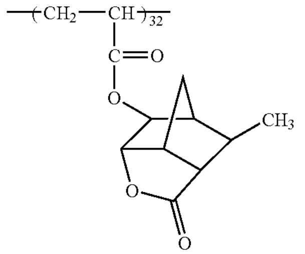

-continued
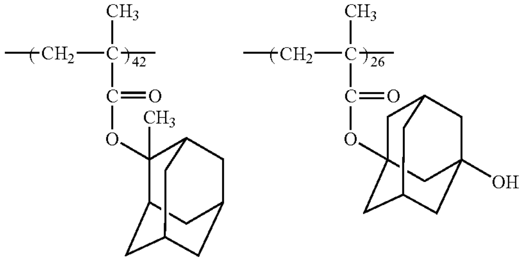
(5)
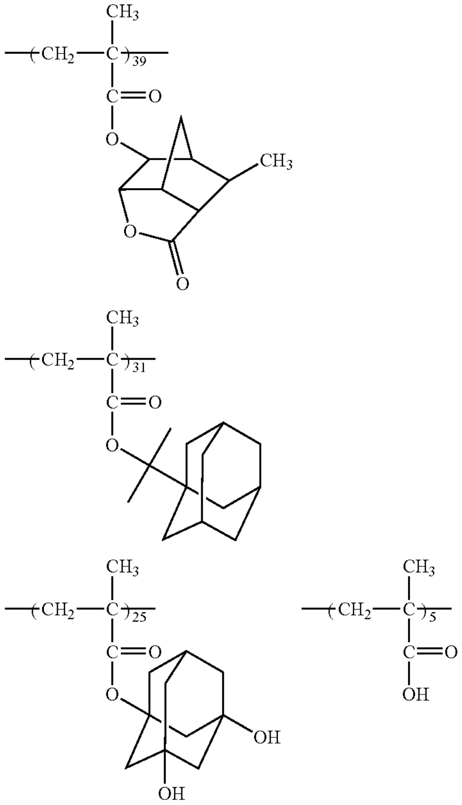
(6)
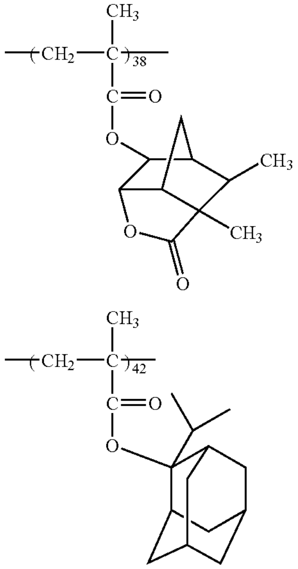
-continued
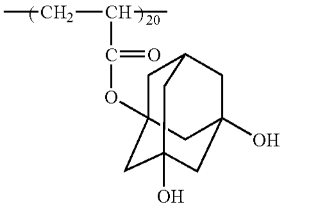
(7)
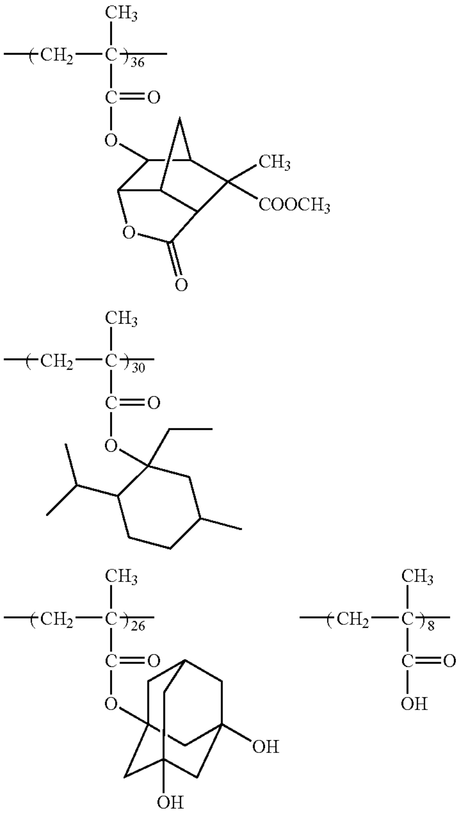
(8)
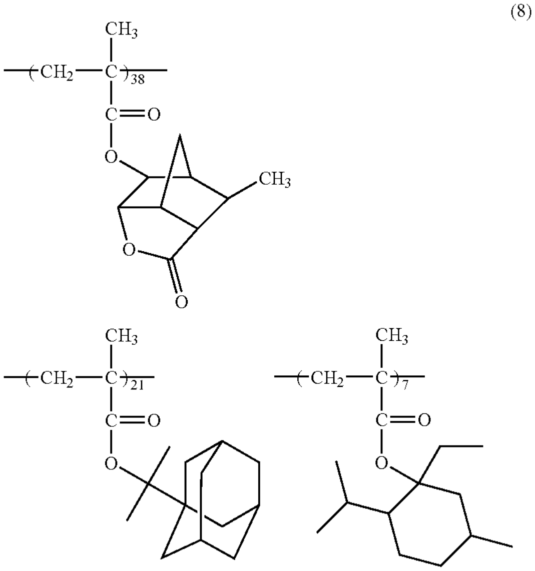

-continued
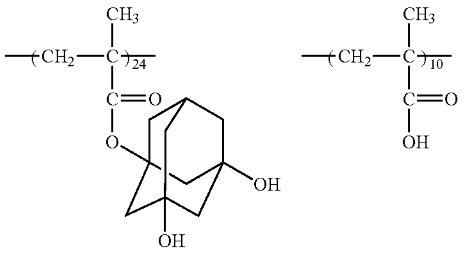
(9)
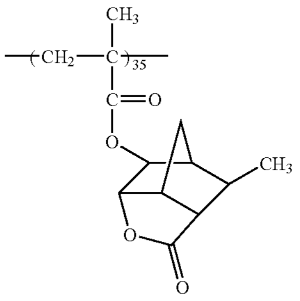
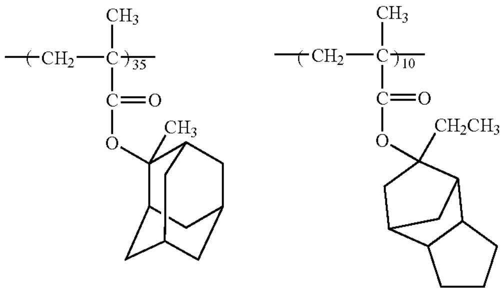
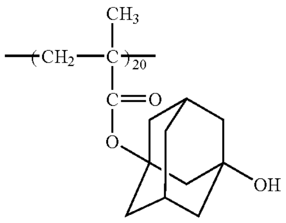
(10)
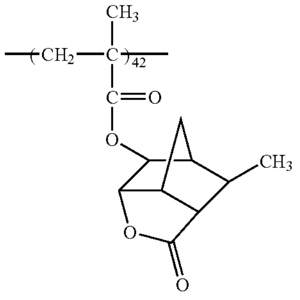
-continued
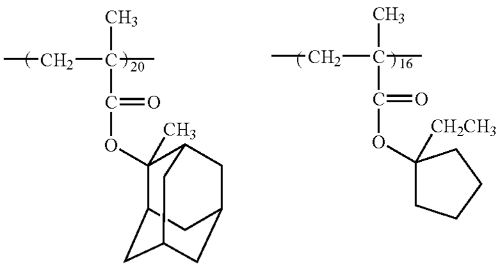
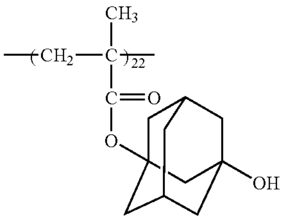
(11)
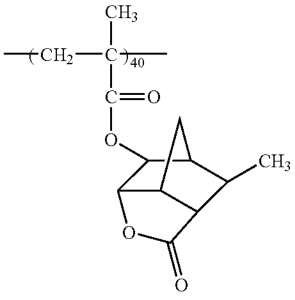
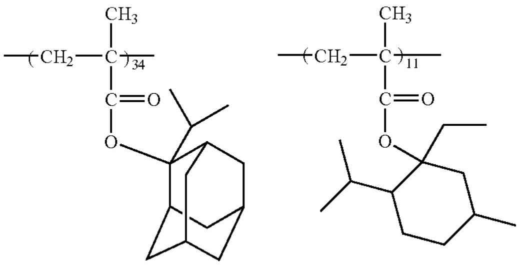
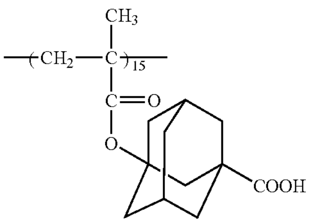

-continued (12)

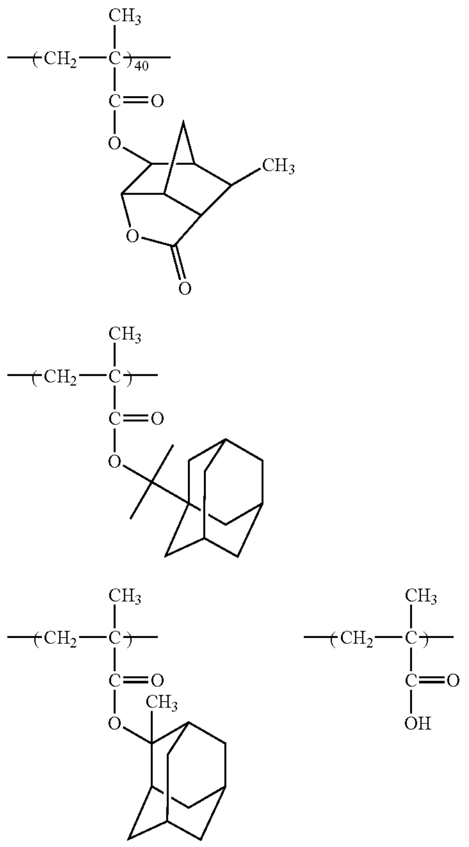

-continued (13)

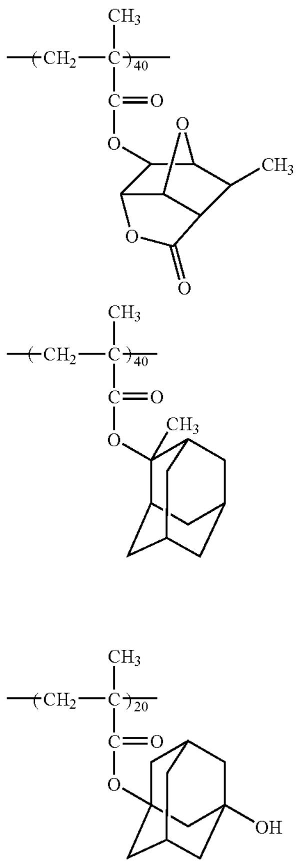

TABLE 1

| Resin | Polymerization Initiator | Chain Transfer Agent | Polymerization Solvent | Molecular Weight | Degree of Dispersion |
|---|---|---|---|---|---|
| (2) | V-501 | none | PGMEA/PGME = 6/4 | 9100 | 1.89 |
| (3) | V-65 | none | PGMEA/PGME = 7/3 | 10100 | 1.92 |
| (4) | V-601 | a | cyclohexanone | 11300 | 1.81 |
| (5) | V-601 | a | cyclohexanone | 8600 | 1.78 |
| (6) | V-601 | none | cyclohexanone | 8900 | 1.74 |
| (7) | V-601 | b | PGMEA/PGME = 6/4 | 9300 | 1.92 |
| (8) | V-601 | none | cyclohexanone | 8700 | 1.93 |
| (9) | V-601 | none | PGMEA/PGME = 6/4 | 9700 | 1.96 |
| (10) | V-501 | none | PGMEA/PGME = 6/4 | 9900 | 1.91 |
| (11) | V-601 | none | PGMEA/PGME = 6/4 | 10400 | 1.99 |
| (12) | V-601 | c | PGMEA/PGME = 6/4 | 11200 | 1.97 |
| (13) | V-601 | none | PGMEA/PGME = 6/4 | 9200 | 1.92 |

V-501: 4,4'-azobis(4-cyanovaleric acid)

V-65: 2,2-azobis(2,4-dimethylvaleronitrile)

a: $C_6H_{13}CH_2SH$ b: thioglycerol c: dodecylmercaptane

Examples 1 to 13 and Comparative Examples 1 to 3

(Preparation and Evaluation of Positive Resist Composition)

<Preparation of Resist Composition>

100 g of a resin, and a photoacid generator, a basic compound and a surfactant in kinds and amounts shown in a following table were dissolved in 1.4 kg of a solvent shown in the table, and filtered through a polyethylene filter of a pore size of 0.03 μm to obtain resists.

<Evaluation of Resist>

On a silicon wafer, ARC 29A, manufactured by Brewer Science Inc., was uniformly coated with a thickness of 78 nm by a spin coater, dried for 60 seconds at 205° C., to obtain an antireflection film. Then each photosensitive composition, immediately after the preparation, was coated with a spin coater and heated for 90 seconds at a temperature (PB temperature) shown in the table to obtain a resist film of a thickness of 200 nm.

The resist film was exposed in an ArF excimer laser stepper (PAS5500/1100, manufactured by ASML Inc., NA=0.75, 2/3 annular irradiation) through a mask, and, immediately after the exposure, heated for 90 seconds at a temperature (PEB temperature) shown in the table on a hot plate. It was then developed for 60 seconds at 23° C. with a 2.38 weight % aqueous solution of tetramethylammonium hydroxide, rinsed for 30 seconds with deionized water and dried to obtain a resist pattern.

*Evaluation of LWR (Line Width Roughness)

A resist pattern obtained with an exposure amount capable of reproducing a Line-and-Space pattern of 90 nm (pitch 180 nm) was subjected, under S-9260 manufactured by Hitach High-Technology Ltd., to a measurement of line width in 50 positions, and a deviation 3σ within a same pattern was defined as LWR.

*Evaluation of In-Plane Uniformity of Line Width

A resist pattern obtained by exposing the entire surface of an 8-inch wafer with an exposure amount capable of reproducing a Line-and-Space pattern of 90 nm (pitch 180 nm) was subjected to a measurement of line width in random 50 positions on the entire surface of the wafer, and a deviation 3σ was defined as in-plane uniformity.

*Evaluation of Development Defect

A resist pattern was obtained by exposing the entire surface of an 8-inch wafer with an exposure amount capable of reproducing a Line-and-Space pattern of 90 nm (pitch 180 nm). It was then subjected to a measurement of development defects by Intelligent Line Monitor 2360 manufactured by KLA Tencor Ltd.

TABLE 2

| | Resin | Photoacid Generator (g) | Basic Compound (g) | Surfactant | Solvent (weight ratio) | PB/PEB | LWR | In-plane Uni-formity | Development Defect |
|---|---|---|---|---|---|---|---|---|---|
| Example 1 | (1) | PAG-B (4) | tributyl-amine (0.6) | none | PGMEA | 130/130 | 7 nm | 11 nm | 125 |
| Example 2 | (2) | z14 (4.3) | 1 (0.4) | 1 | PGMEA/γBL (57/3) | 120/120 | 6.8 nm | 10.5 nm | 108 |
| Example 3 | (3) | PAG-B (4) | tributyl-amine (0.6) | none | PGMEA/PGME (7/3) | 120/120 | 6.7 nm | 10.8 nm | 130 |
| Example 4 | (4) | PAG-A (4) | 2,6-diiso-propylaniline (0.4) | none | PGMEA/γBL (57/3) | 130/130 | 6.0 nm | 10.3 nm | 96 |
| Example 5 | (5) | z58 (3.2)<br>z60 (2.0) | 5 (0.4) | 3 | PGMEA/PGME (6/4) | 120/120 | 5.7 nm | 8.7 nm | 35 |
| Example 6 | (6) | z14 (2)<br>z55 (1.5) | 2 (0.4) | 4 | PGMEA/PGME (6/4) | 115/115 | 5.4 nm | 9.9 nm | 68 |
| Example 7 | (7) | z38 (4)<br>z27 (0.1) | 3 (0.4) | 5 | PGMEA/PGME (7/3) | 120/120 | 5.5 nm | 7.9 nm | 71 |
| Example 8 | (8) | z58 (4)<br>z24 (0.5) | 5 (0.4) | 5 | PGMEA/PGME (7/3) | 120/120 | 5 nm | 5.3 nm | 54 |
| Example 9 | (9) | z58 (3.2)<br>z60 (2.2) | 4 (0.4) | 5 | PGMEA/cyclo-hexanone (7/3) | 130/130 | 5.2 nm | 6.1 nm | 74 |
| Example 10 | (10) | z20 (0.1)<br>z58 (3.2)<br>z61 (2) | 4 (0.4) | 5 | PGMEA/EL (8/2) | 130/130 | 5 nm | 6.3 nm | 89 |
| Example 11 | (11) | z38 (1.8)<br>z55 (1.5) | 2 (0.4) | 5 | PGMEA/cyclo-hexanone (7/3) | 115/115 | 6.5 nm | 6.8 nm | 106 |
| Example 12 | (12) | z15 (2.2)<br>z55 (1.5) | 2 (0.4) | 5 | PGEMA/cyclo-hexanone (7/3) | 120/120 | 6.3 nm | 6.9 nm | 111 |
| Example 13 | (13) | z2 (4) | tributyl-amine (0.6) | none | PGMEA | 130/130 | 6.9 nm | 11 nm | 118 |
| Comparative Example 1 | resin A | PAG-A (4) | 2,6-diiso-propylani-line (0.4) | none | PGMEA/γBL (57/3) | 130/130 | 10 nm | 13 nm | 2670 |
| Comparative Example 2 | resin B | PAG-B (4) | tributyl-amine (0.6) | none | PGMEA | 110/110 | 11 nm | 15 nm | 3390 |
| Comparative Example 3 | resin C | z2 (4) | tributyl-amine (0.6) | none | PGMEA | 120/120 | 14 nm | 18 nm | 4190 |

In the table, abbreviations indicate specific examples described before and followings:

Resin A: resin A11 in JP-A No. 2002-296783

Resin B: resin 13 in JP-A No. 2000-159758

Resin C: following structures

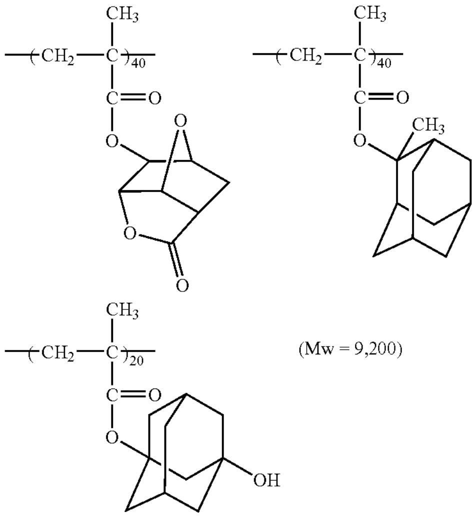

(Mw = 9,200)

PAG-A: p-tollyldiphenylsulfonium perfluorooctanesulfonate (acid generator B1 in JP-A No. 2002-296783)

PAG-B: following structure (PAG2 in JP-A No. 2000-159758)

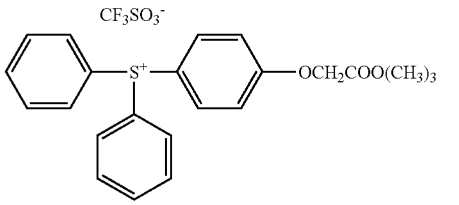

[Surfactant]

1: Megafac F176 (manufactured by Dai-Nippon Inks and Chemicals, Inc.) (containing fluorine)

2: Megafac R08 (manufactured by Dai-Nippon Inks and Chemicals, Inc.) (containing fluorine and silicon)

3: polysiloxane polymer KP-341 (manufactured by Shin-etsu Chemical Co.)

4: polyoxyethylene nonylphenyl ether

5: Troysol S-366 (manufactured by Troy Chemical Co.)

[Basic Compound]

1: N,N-dihydroxyethylaniline

2: N,N-dibutylaniline

3: trioctylamine

4: following structure

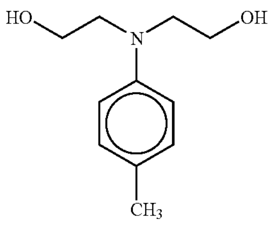

5: following structure

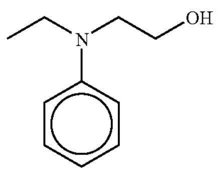

Results in Table 2 indicate clearly that the positive resist composition of the present invention is improved in development defect, and provides an excellent in-plane uniformity of line width and an excellent LWR performance.

The present invention allows to provide a positive resist composition capable of improving a problem of development defect, providing an excellent in-plane uniformity of line width, and providing an excellent LWR property, and a pattern forming method utilizing the same.

The entire disclosure of each and every foreign patent application from which the benefit of foreign priority has been claimed in the present application is incorporated herein by reference, as if fully set forth.

What is claimed is:

1. A positive resist composition comprising:

(A) a resin that comprises a repeating unit represented by formula (1) and a repeating unit represented by formula (2), and that increases a solubility of the resin (A) in an alkaline developer by an action of an acid; and (B) a compound that generates an acid upon treatment with one of an actinic ray and radiation:

(1)

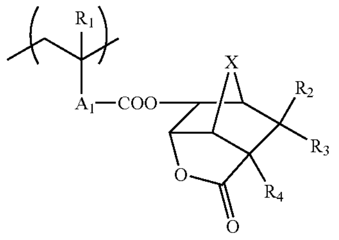

(2)

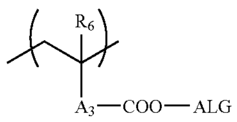

wherein $R_1$ represents a hydrogen atom or an alkyl group;

$R_2$ represents an alkyl group or an alkoxy group;

$R_3$ represents a hydrogen atom, an alkyl group, an alkoxy group, a carboxyl group or a group represented by $-COOR_7$, in which $R_7$ represents a hydrocarbon group;

$R_4$ represents a hydrogen atom or an alkyl group;

X represents a methylene group or an oxygen atom;

$R_6$ represents a hydrogen atom or an alkyl group;

$A_1$ represents a single bond or a divalent connecting group;

$A_3$ represents a single bond or a divalent connecting group; and

ALG represents a partial structure including an alicyclic hydrocarbon represented by formulae (pI) to (pV):

(pI)

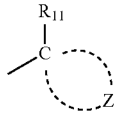

(pII)

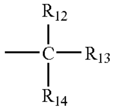

(pIII)

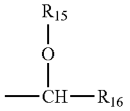

(pIV)

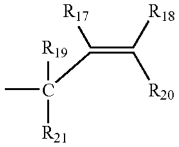

(pV)

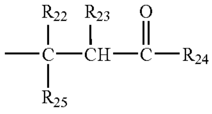

wherein $R_{11}$ represents an alkyl group; and Z represents an atomic group necessary for forming an alicyclic hydrocarbon group together with a carbon atom;

$R_{12}$ to $R_{16}$ each independently represents an alkyl group or an alicyclic hydrocarbon group, provided that at least one of $R_{12}$ to $R_{14}$ or one of $R_{15}$ and $R_{16}$ represents an alicyclic hydrocarbon group;

$R_{17}$ to $R_{21}$ each independently represents a hydrogen atom, an alkyl group or an alicyclic hydrocarbon group, provided that at least one of $R_{17}$ to $R_{21}$ represents an alicyclic hydrocarbon group, and one of $R_{19}$ and $R_{21}$ represents an alkyl group or an alicyclic hydrocarbon group; and $R_{22}$ to $R_{25}$ each independently represents an alkyl group or an alicyclic hydrocarbon group, provided that at least one of $R_{22}$ to $R_{25}$ represents an alicyclic hydrocarbon group, and $R_{23}$ and $R_{24}$ may be mutually bonded to form a ring.

2. The positive resist composition according to claim 1, wherein the resin (A) further comprises a repeating unit represented by formula (3):

(3)

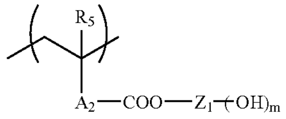

wherein $R_5$ represents a hydrogen atom or an alkyl group;

$Z_1$ represents an (m+1)-valent alicyclic hydrocarbon group;

$A_2$ represents a single bond or a divalent connecting group; and m represents an integer of 1 to 3.

3. The positive resist composition according to claim 2, wherein the repeating unit represented by formula (3) is a repeating unit represented by formula (Ia):

(Ia)

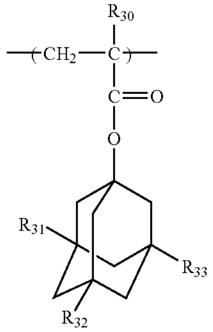

wherein $R_{30}$ represents a hydrogen atom or a methyl group; and $R_{31}$ to $R_{33}$ each independently represents a hydrogen atom, a hydroxyl group or an alkyl group, provided that at least one of $R_{31}$ to $R_{33}$ represents a hydroxyl group.

4. The positive resist composition according to claim 1, wherein the resin (A) further comprises a repeating unit having an alicyclic lactone structure.

5. The positive resist composition according to claim 1, wherein the resin (A) further comprises a methacrylic acid repeating unit.

6. The positive resist composition according to claim 1, wherein the resin (A) comprises two or more repeating units represented by formula (2) in which groups represented by ALG of the two or more repeating units are mutually different.

7. A pattern forming method comprising:

forming a resist film from a positive resist composition according to claim 1;

exposing the resist film, so as to form an exposed resist film; and developing the exposed resist film.

* * * * *